(12) United States Patent
Efland et al.

(10) Patent No.: US 8,149,904 B2
(45) Date of Patent: Apr. 3, 2012

(54) ASYMMETRIC DIGITAL SUBSCRIBER LINE MODEM APPARATUS AND METHODS THEREFOR

(75) Inventors: Gregory H. Efland, Palo Alto, CA (US);
Haixiang Liang, Palo Alto, CA (US);
Kevin H. Peterson, Mountain View, CA (US); Yuanjie Chen, San Jose, CA (US);
Alan G. Corry, Santa Clara, CA (US);
Nino P. Ferrario, Sunnyvale, CA (US);
Jeff Z. Guan, San Ramon, CA (US);
Meera Prahlad, Saratoga, CA (US);
Ilya Stomakhin, Cupertino, CA (US);
Yongbing Wan, San Jose, CA (US);
Larry C. Yamano, Sunnyvale, CA (US);
Lin Yin, Fremont, CA (US); Gong-San Yu, Milpitas, CA (US); George A. Papanicolaou, Scarborough (CA)

(73) Assignee: Broadcom Corporation, Irvine, CA (US)

( * ) Notice: Subject to any disclaimer, the term of this patent is extended or adjusted under 35 U.S.C. 154(b) by 1298 days.

(21) Appl. No.: 10/350,279

(22) Filed: Jan. 24, 2003
(Under 37 CFR 1.47)

(65) Prior Publication Data
US 2003/0210740 A1 Nov. 13, 2003

Related U.S. Application Data

(60) Provisional application No. 60/350,253, filed on Jan. 24, 2002.

(51) Int. Cl.
*H04B 1/38* (2006.01)

(52) U.S. Cl. ........ 375/222; 375/225; 375/226; 375/227; 375/355

(58) Field of Classification Search ................... 375/222, 375/259, 260, 220, 216, 249, 248, 130, 326, 375/375, 350, 355, 221; 370/328, 336
See application file for complete search history.

(56) References Cited

U.S. PATENT DOCUMENTS

| 4,074,086 A | 2/1978 | Falconer et al. |
| 4,151,524 A * | 4/1979 | Caputi, Jr. ...................... 342/50 |
| 4,982,428 A | 1/1991 | Agazzi et al. |

(Continued)

FOREIGN PATENT DOCUMENTS
EP  0 806 852 A2  11/1997

OTHER PUBLICATIONS

International Search Report for Appln. No. PCT/US03/02154, mailed Aug. 19, 2003, 6 pages.

(Continued)

*Primary Examiner* — Khanh C Tran
*Assistant Examiner* — Qutbuddin Ghulamali
(74) *Attorney, Agent, or Firm* — Sterne, Kessler, Goldstein & Fox PLLC

(57) ABSTRACT

Provided is a system and method for a modem including one or more processing paths. Also included is a number of interconnected modules sequentially arrayed along the one or more paths. Each module is configured to (i) process signals passed along the paths in accordance with the sequence and (ii) implement predetermined functions to perform the processing. Further, each of the modules has a particular degree of functional programmability and the degrees of functional programmability monotonically vary in accordance with the sequence.

15 Claims, 23 Drawing Sheets

U.S. PATENT DOCUMENTS

| | | | |
|---|---|---|---|
| 5,309,484 A | 5/1994 | McLane et al. | |
| 5,491,652 A | 2/1996 | Luo et al. | |
| 5,550,860 A * | 8/1996 | Georgiou et al. | 375/220 |
| 5,668,830 A * | 9/1997 | Georgiou et al. | 375/220 |
| 5,671,250 A | 9/1997 | Bremer et al. | |
| 5,742,527 A | 4/1998 | Rybicki et al. | |
| 5,872,993 A | 2/1999 | Brown | |
| 5,909,463 A | 6/1999 | Johnson et al. | |
| 6,035,313 A | 3/2000 | Marchant | |
| 6,202,178 B1 | 3/2001 | Spruyt | |
| 6,219,816 B1 | 4/2001 | Tezuka | |
| 6,256,723 B1 | 7/2001 | Hudson et al. | |
| 6,272,168 B1 * | 8/2001 | Lomp et al. | 375/222 |
| 6,332,000 B1 * | 12/2001 | Lee | 375/232 |
| 6,456,649 B1 * | 9/2002 | Isaksson et al. | 375/222 |
| 6,539,052 B1 * | 3/2003 | Hessel et al. | 375/225 |
| 6,563,862 B1 * | 5/2003 | Knutson et al. | 375/219 |
| 6,584,145 B1 * | 6/2003 | Camagna et al. | 375/216 |
| 6,650,697 B1 * | 11/2003 | Tate et al. | 375/222 |
| 6,894,989 B1 * | 5/2005 | Chadha et al. | 370/289 |
| 7,039,103 B2 * | 5/2006 | Shenoi et al. | 375/220 |
| 7,257,328 B2 * | 8/2007 | Levinson et al. | 398/182 |
| 2003/0076802 A1 * | 4/2003 | Cooley et al. | 370/336 |
| 2005/0265428 A1 * | 12/2005 | McCorkle | 375/130 |
| 2006/0090002 A1 * | 4/2006 | Liu | 709/230 |

OTHER PUBLICATIONS

European Search Report for Appln. No. EP 03713281.8, mailed Mar. 24, 2010, 9 pages.

* cited by examiner

DMA Parameters:

```
Stride     = 4
Stride2    = 4 + 3 = 7
Offset     = 0
Offset INC = 4
Offset Mod = 5
```

FIG. 7

DMA Address Sequence:

| Step | Offset | Address |
|---|---|---|
| 0 | 0 | A |
| 1 | 4 | A+4 |
| 2 | 3 | A+11 |
| 3 | 2 | A+18 |
| 4 | 1 | A+25 |

FIG. 8

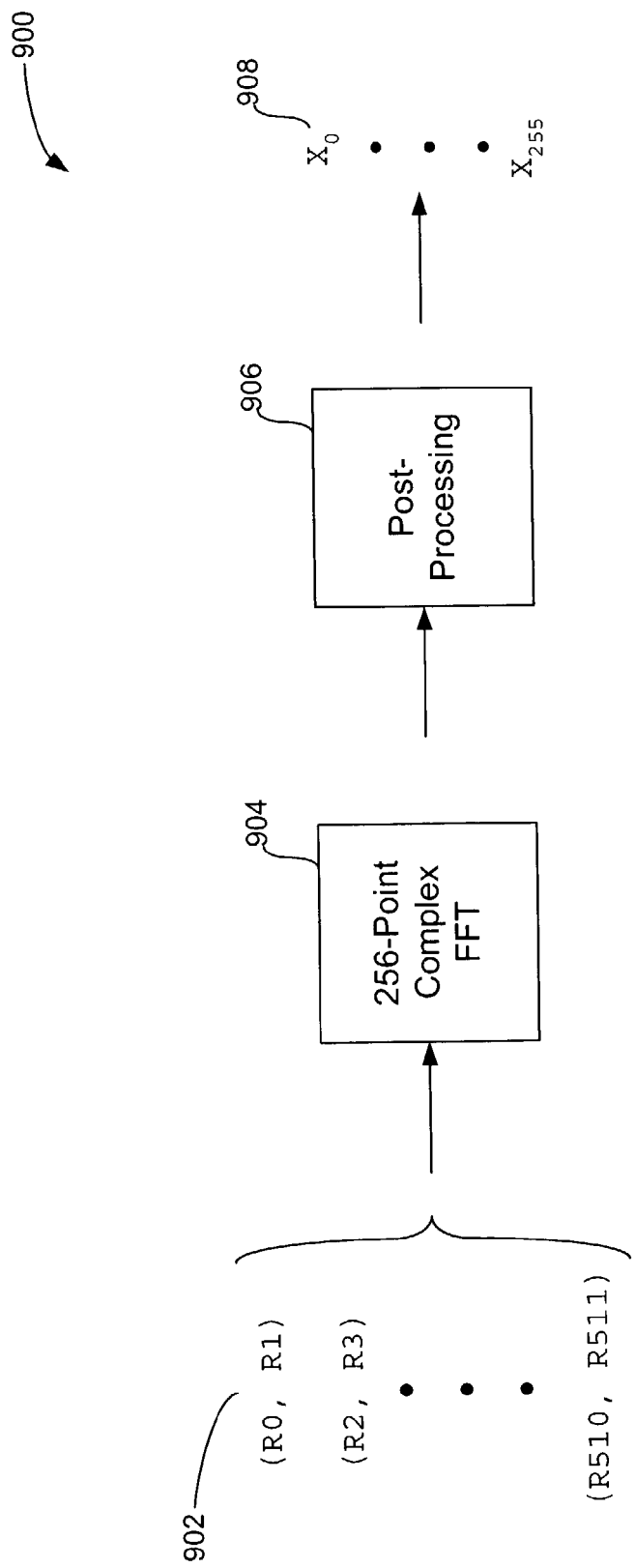
FIG. 9
(conventional)

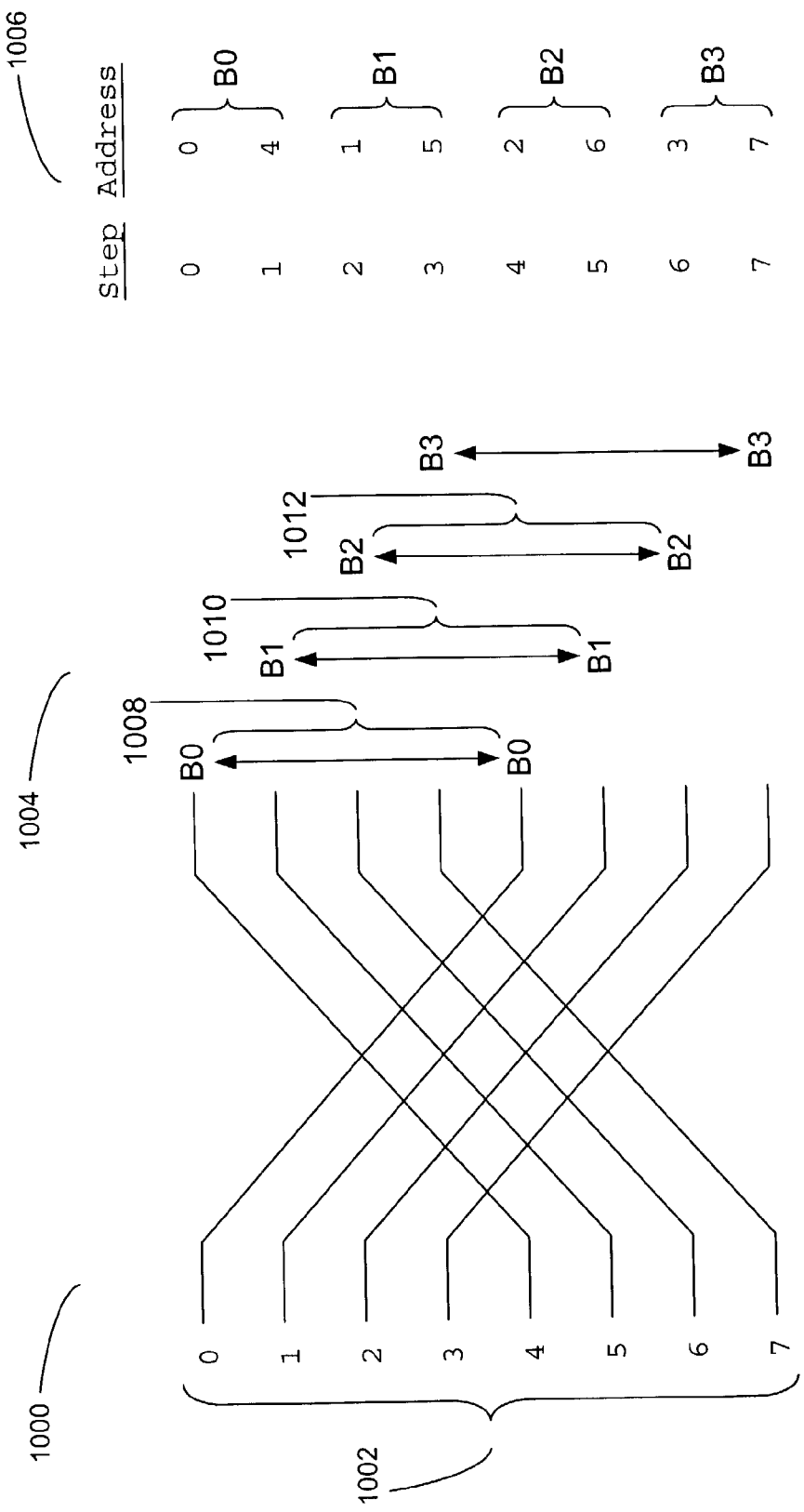
FIG. 10
(conventional)

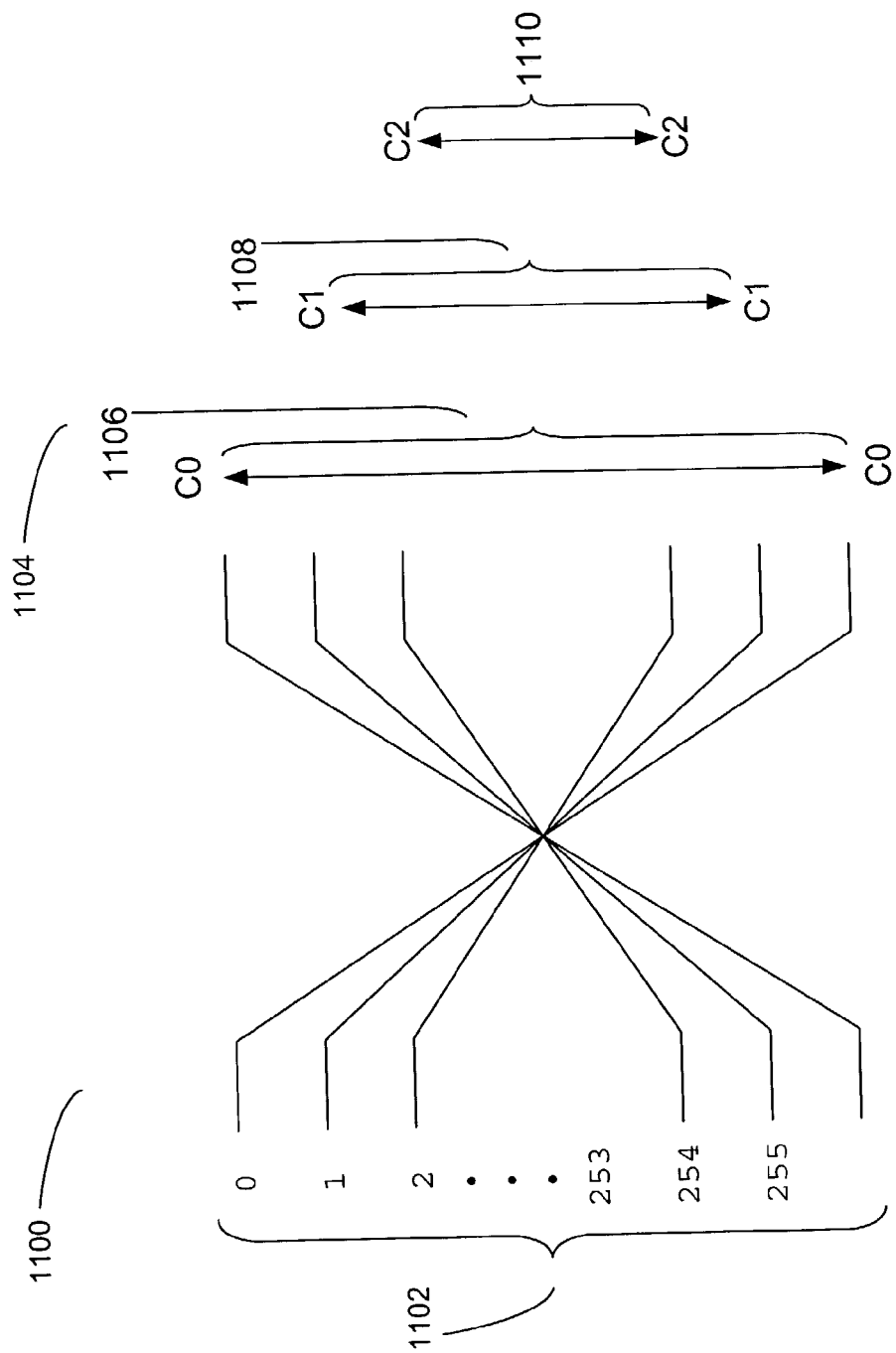
FIG. 11 (conventional)

| STEP | FFT Address Gen. ~1402 | Conditionally Inverted Address ~1404 |
|---|---|---|
| 2 | 1 | 1 |
| 3 | 128 | 255 |
| 4 | 2 | 2 |
| 5 | 127 | 254 |
| 6 | 3 | 3 |
| 7 | 130 | 253 |
| ••• | | |
| 254 | 127 | 127 |
| 255 | 254 | 129 |

FIG. 14

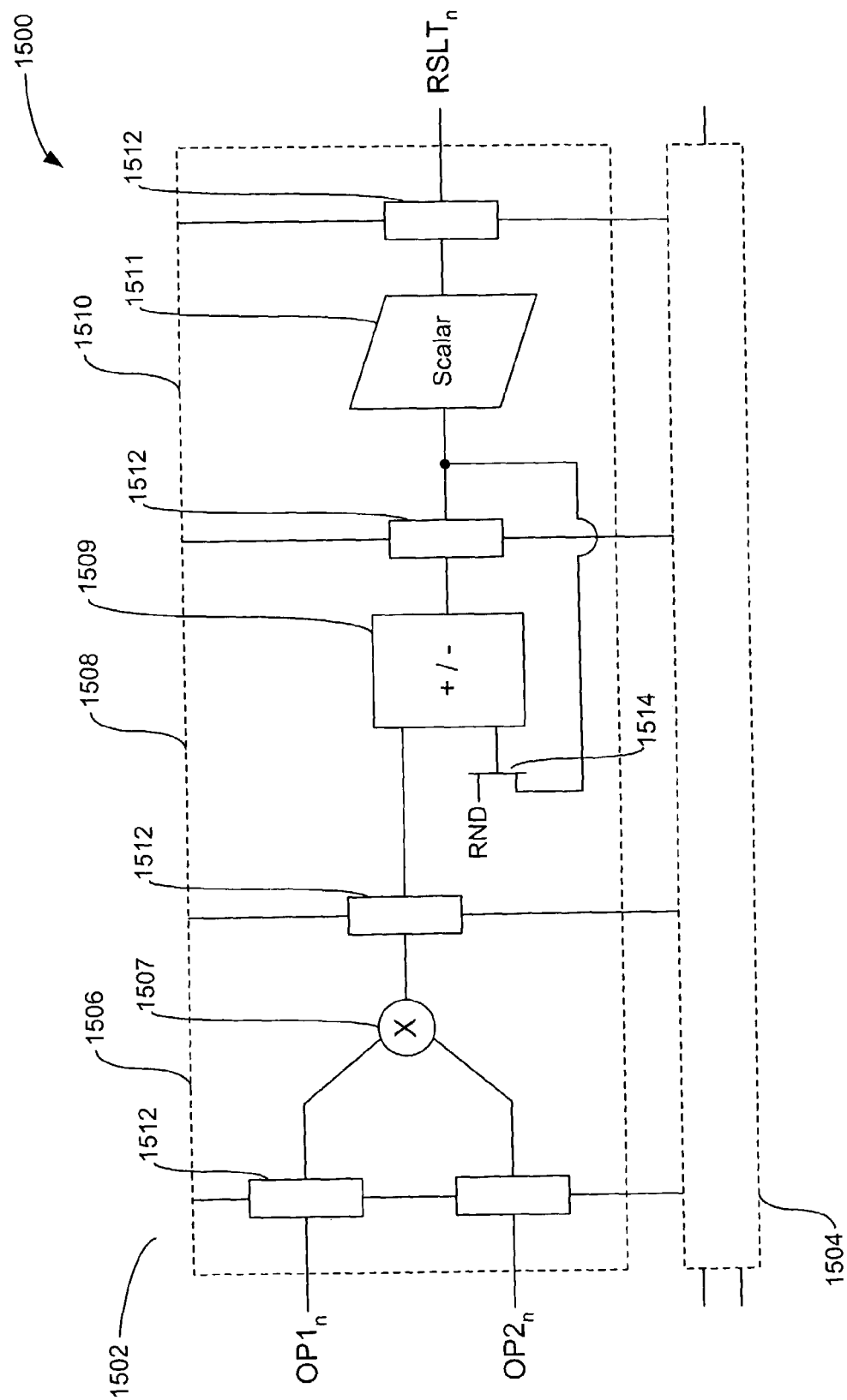
FIG. 15
(conventional)

|  | Cycle | Quantize | I Limit | I Condition | Q Limit | Q Condition | Acc I | Acc Q |
|---|---|---|---|---|---|---|---|---|
| 'A' | 1 | Yes | - | - | - | - | -1 | -1 |
|  | 2 | No | -3 | < | -3 | < | -1 | -1 |
| 'B' | 1 | Yes | - | - | - | - | -1 | -5 |
|  | 2 | No | 3 | ≥ | -3 | < | -1 | -3 |

ASYMMETRIC DIGITAL SUBSCRIBER LINE MODEM APPARATUS AND METHODS THEREFOR

CROSS-REFERENCE TO RELATED APPLICATIONS

This application claims the benefit of U.S. Provisional Application No. 60/350,253, filed Jan. 24, 2002, entitled "Asymmetric Digital Subscriber Line Modem Apparatus and Methods Therefor," which is incorporated by reference herein in its entirety.

BACKGROUND OF THE INVENTION

1. Field of the Invention

The present invention generally relates to communications, and more specifically to a highly integrated asymmetric digital subscriber line (ADSL) circuit chip for communications.

2. Background Art

An ADSL is used for data communications between a central office (CO) and customer premise equipment (CPE). At the CPE, an ADSL transceiver transmits and receives ADSL data to and from the central office. Conventional ADSL transceivers include an analog front end (AFE), a discrete multi-tone module (DMT), a forward error correction (FEC) module, a multiplexer/framer module, a protocol module, and a direct memory access (DMA) module.

BRIEF SUMMARY OF THE INVENTION

Consistent with the principles of the present invention as embodied and broadly described herein, an embodiment of the present invention includes a modem comprising one or more processing paths. Also included is a number of interconnected modules sequentially arrayed along one or more of the paths. Each module is configured to (i) process signals passed along the paths in accordance with the sequence and (ii) implement predetermined functions to perform the processing. Further, each of the modules has a particular degree of functional programmability and the degrees of functional programmability monotonically vary in accordance with the sequence.

Another embodiment of the invention includes a modem comprising a receive re-sampler associated with a receive timing scheme and a transmit re-sampler associated with a transmit timing scheme. Only one timing mechanism is provided. The timing mechanism is (i) electrically coupled to the receive re-sampler and the transmit re-sampler and (ii) configured to synchronize the receive and transmit timing schemes.

A further embodiment of the invention includes a method for de-interleaving a data stream stored in a buffer having a plurality of memory locations, each location having a memory width of (W) bytes, the data stream being formed of a number of data words each including (N)-number of data bytes, wherein (N) is a non-integer multiple of the width (W). The method comprises storing the data words into respective memory locations. The method also includes appending each of the copied data words with a number (X) of dummy bytes, a sum of (N)+(X) being an integer multiple of the width (W) and storing the appended dummy bytes into the respective memory locations.

Still another embodiment of the present invention includes a circuit comprising a fast fourier transform (FFT) address generator configured to produce a complex FFF (computation) address sequence, the complex FFT address sequence includes fixed offsets. Also included is a conversion mechanism configured to (i) receive the complex FFT address sequence and (ii) convert the received sequence into an address sequence having varying offsets.

A further embodiment of the present invention includes a method for implementing a SLICE operation in a programmable digital signal processor (DSP) as a primitive instruction in one or more data paths of a single instruction multiple data scheme (SIMD).

Yet another embodiment of the present inventions includes a method for sharing one or more memories between one or more processors, each memory being associated with a respective ownership flag. The method comprises associating each of the processors with a particular value of the flag and assigning use of the memories to a corresponding one of the processors when the respective ownership flag is set to the particular value.

Further features and advantages of the present invention, as well as the structure and operation of various embodiments of the present invention, are described in detail below with reference to the accompanying drawings.

BRIEF DESCRIPTION OF THE DRAWINGS/FIGURES

The accompanying drawings, which are incorporated in and constitute part of the specification, illustrate embodiments of the invention and, together with the general description given above and detailed description of the embodiments given below, serve to explain the principles of the present invention.

FIG. 7 is a table of exemplary parameters associated with the memory buffer of FIG. 6;

FIG. 8 is a table of exemplary address sequences associated with the memory buffer of FIG. 6 and the parameters table of FIG. 7;

FIG. 9 is an illustration of conventional processing modules associated with implementing a fast Fourier transform (FFT);

FIG. 10 is an illustration of conventional FTT computational butterflies configured to implement a pre-processing in the FFT of FIG. 9;

FIG. 11 is an illustration of conventional FFT computational butterflies configured to implement a post-processing in the FFT of FIG. 9;

FIG. 14 is an illustration of exemplary output address sequences produced in accordance with an embodiment of the present invention;

FIG. 15 is a block diagram illustration of a conventional data processing path of a DSP;

FIG. 20 is a table illustrating output cycles of an embodiment of the present invention;

DETAILED DESCRIPTION OF THE INVENTION

The following detailed description of the accompanying drawings illustrates exemplary embodiments consistent with the present invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one of skill in the art that the present invention, as described below, may be implemented in many different embodiments of hardware, software, firmware and/or the entities illustrated in the figures. Any actual software code with the specialized control hardware to implement the present invention, is not limiting of the present invention. Thus, the operation and behavior of the present invention will be described with the understanding that modifications and variations of the embodiments are possible, given the level of detail presented herein.

I. Functional Programmability.

Figure 1:
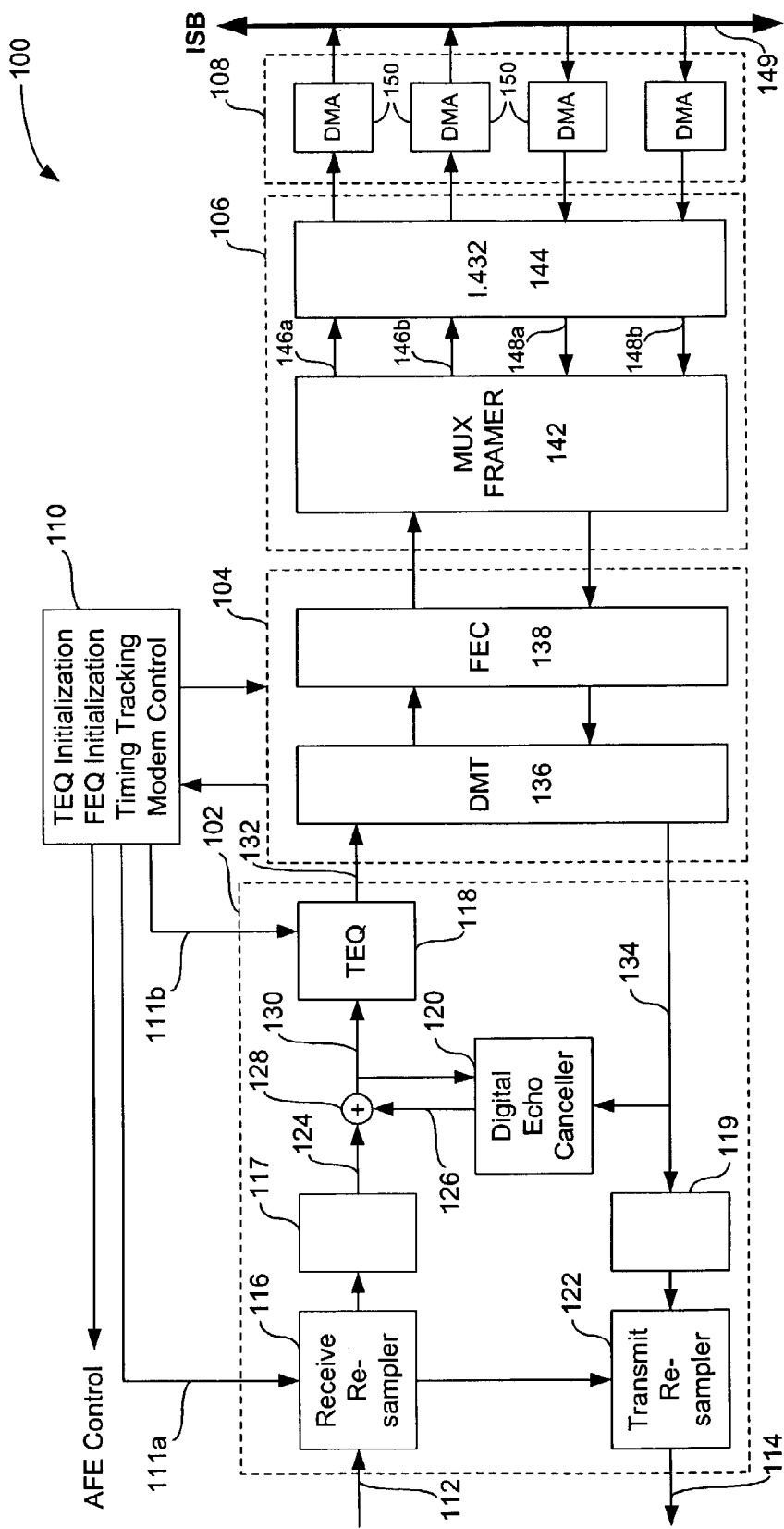
FIG. 1 is a block diagram of an exemplary ADSL modem.

FIG. 1 is a block diagram of an exemplary ADSL modem 100. Different aspects of the present invention reside in the environment of the modem 100. The modem 100 includes a first portion 102 including fixed components (also referred to as modules), a second portion 104 including programmable modules, a third portion 106 also including programmable modules, and a data transfer portion 108.

The modem 100 also includes a control module 110 including a plurality of control modules that perform modem control, receive signal timing recovery and tracking, equalizer (TEQ and FEQ) initialization and filter initialization. The control module 110 provides control signals 111a, 111b, and 111c (collectively, signals 111) to components within the first portion 102, described below, as well as to components with the second portion 104. In a receive direction, the modem 100 receives a digitized receive signal 112 having a fixed sample rate of 4 MHz from an analog-to-digital converter (ADC) (not shown). In a transmit direction, the modem 100 provides a digitized transmit signal 114 having a fixed sample rate of 2 MHz to a digital-to-analog converter (DAC) (not shown).

The fixed portion 102 includes a receive re-sampler 116, a receive integer decimator 117, a time domain equalizer (TEQ) 118, a digital echo canceller 120, an integer interpolation module 119 and a transmit re-sampler 122. In the receive direction, the receive re-sampler 116 re-samples/re-times signal 112 to produce a re-sampled/retimed signal 320 having a sample rate of twice the ADSL sample rate of 2.208 MHz. The receive integer decimator 117 is a finite impulse response (FIR) filter that downsamples the signal 320 to produce the signal 124. In other words, the receive re-sampler 116 in conjunction with the receive integer decimator 117 converts the fixed 4 MHz sample rate of the received signal 112 to the ADSL sample rate of 2.208 MHz.

A digital echo canceller 120 cancels undesired echo from the signal 124. The canceller 120 provides an echo canceling signal 126 to a subtractor 128. The subtractor 128 subtracts the echo canceling signal 126 from the signal 124, to produce a signal 130. The signal 130 is applied to the canceller 120 as an error signal, and also to the TEQ 118.

The TEQ 118 is a finite impulse response (FIR) filter having programmable filter coefficients. The TEQ 118 has a filter response/transfer function that reduces inter-symbol interference in the receive signal 112, caused by the receive channel from which the signal 112 was received. The TEQ 118 provides an equalized signal 132 to the portion 104 of the modem 100.

In a transmit direction, the portion 104 provides a transmit signal 134 to the module 119 and the digital echo canceller 120. The module 119 consists of a series cascade of finite impulse response (FIR) filters and interpolates the signal 134 by an integer factor to produce the signal 360. The transmit re-sampler 122 re-samples/re-times signal 360 to produce the re-sampled/retimed transmit signal 114. The transmit re-sampler 122 up-samples the signal 360 to produce the signal 114. In other words, the transmit re-sampler 122 converts the 2.208 MHz sample rate of the received signal 360 to the DAC sample rate of 2.0 MHz.

It would be apparent to one skilled in the art that the receive re-sampler 116 output sample rate and the transmit re-sampler 122 input sample rate will be slightly different than 4.416 MHz and 2.208 MHz respectively if there is any clock error in the system.

The receive re-sampler 116, the TEQ 118, and the transmit re-sampler 122, each receive control information, such as filter coefficients, as well as other control signals, from the control modules of the control module 110.

The receive re-sampler 116, the receive integer decimator 117, the TEQ 118, the integer interpolation module 119, the echo canceller 120, and the transmit re-sampler 122 are implemented as hardware modules using "fixed gates." This means that each of the modules 116-122 performs a sequence of operations in a predetermined order that cannot be changed. Each of the modules 116-122 may be selectively enabled and disabled. However, the order of processing steps implemented by each hardware module, alone, and together with the other modules within the portion 102, will always remain the same.

The programmable portion 104 includes a DMT module 136 and an FEC module 138. Together, the DMT/FEC modules 136/138 are referred to as a DMT/FEC accelerator. To process signals flowing in the receive direction, the DMT module 136 includes, in series, a fast Fourier transform (FFT) module to perform FFTs, a frequency domain equalizer (FEQ) to perform frequency domain equalization, and a symbols-to-bits mapper to map symbols-to-bits. Symbol-to-bit mapping optionally includes trellis decoding. To process signals flowing in the transmit direction, the DMT module 136 includes a bits-to-symbols mapper, a gain scaler, and an inverse fast Fourier transform (IFFT) module to perform IFFTs. Bit-to-symbol mapping optionally includes trellis encoding.

To process signals flowing in the receive direction, FEC module 138 includes a Reed-Solomon decoder. To process signals flowing in the transmit direction, the FEC 138 includes a Reed-Solomon encoder.

The DMT/FEC accelerator (the portion 104 of the modem 100) is programmable, and thus more flexible than the portion 102 of the modem 100. In other words, the DMT/FEC accelerator 104 has a higher degree of functional programmability than the portion 104. For example, the various functions performed by the modules within the DMT/FEC accelerator 104 may be changed and permuted over time. A control processor (not shown in FIG. 1) controls the sequencing of these operations depending on the various modes in which the modem 100 may operate.

For example, as the modem 100 traverses various stages of ADSL signal training, the sequence of operations performed by the DMT/FEC accelerator 104 changes correspondingly. This may be referred to as "modality flexibility" within the DMT/FEC accelerator. In the instant embodiment, the DMT/FEC accelerator 104 is implemented as a combination of hardware and software. An implementation of both hardware and software facilitates the modality flexibility. The DMT/FEC accelerator 104 is programmed to accommodate signal training, and to implement a relatively complicated ADSL handshake that occurs, between the ADSL modem 100 and the central office modem.

Next, the portion 106 of the modem 100 includes a multiplexer/framer 142 and a protocol engine 144. In the receive direction, the multiplexer/framer 142 receives a bit stream from the FEC module 138, and demultiplexes the bit stream into two separate asynchronous transfer mode (ATM) receive channels 146a and 146b. The multiplexer/framer 142 provides the ATM channels 146a and 146b to the protocol engine 144. In the transmit direction, the protocol engine 144 provides two ATM transmit channels 148a and 148b to the multiplexer/framer 142. The multiplexer/framer 142 multiplexes the transmit ATM channels 148a and 148b into a transmit bit-stream 150 for the FEC 138.

The protocol engine 144 operates in accordance with an ATM standard I.432. ATM standard I.432 governs the manner in which ATM cells are constructed and Cyclic Redundancy Codes (CRCs) are computed. Thus, the protocol engine 144 verifies/validates received ATM cells, and generates transmit ATM cell information, such as CRCs, among other things.

A data transfer portion 108 is coupled between the protocol engine 144 and an internal system bus (ISB) 149. The data transfer portion 108 transfers ATM cells or bytes in and out of the modem 100. The data transfer portion 108 includes a plurality of DMA engines 150 for transferring data between the ISB 149 and the protocol engine 144, and other portions of the modem 100.

The portion 106 is completely in software. Thus, the portion 106 has a higher degree of functional programmability than the DMT/FEC accelerator 104, the fixed portion 102, and the data transfer portion 108. The functions associated with the portion 106 are programmable and flexible. For example, protocol engine 144 may operate in accordance with I.432 or any other suitable protocol. Alternatively, as the standard for ADSL evolves, the multiplexer/framer module may be rewritten to accommodate new framing specifications.

Figure 2:
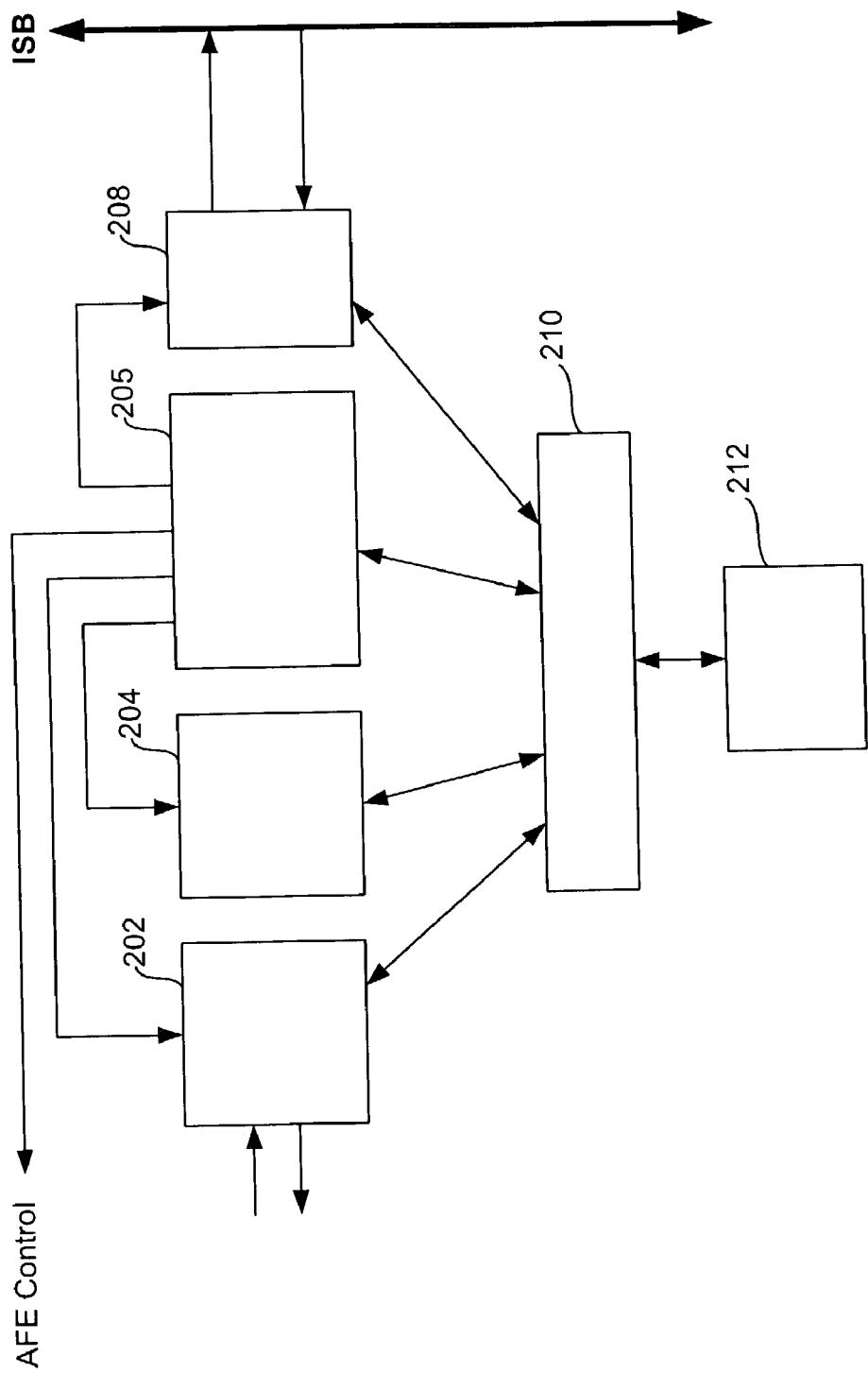
FIG. 2 is a block diagram of an alternative view of the functional modules of the modem of FIG. 1.

FIG. 2 is a block diagram of an alternative view of the functional modules of the modem 100. In the view of FIG. 2, the modem 100 includes an AFE processor 202 corresponding to the portion 102 illustrated in FIG. 1, a DMT/FEC accelerator 204 corresponding to the portion 104 in FIG. 1, a control processor 205 (not specifically depicted in FIG. 1), and a host interface (I/F) 208 corresponding to the data transfer portion 108 in FIG. 1. Also included in the view of FIG. 2 is a multiplexer 210 and a RAM 212 in which communication data and information may be stored.

As described above, the modem portions 102, 104, and 106 are implemented using progressively (monotonically) increasing degrees of programmable functionality and modality flexibility. The ADSL modem environment is very cost sensitive, so cost reduction is critical. The design of the modem 100 achieves cost optimization where possible, and retains flexibility where necessary. This includes reducing cost where little flexibility is needed. Less flexibility is required in the portion 102 compared to the portions 104 and 106. Thus, the portion 102 is implemented as cheaply as possible, using fixed hardware functions that have virtually zero functional programmability.

The portion 104 is more flexible and functionally programmable than the portion 102 because it is implemented as a combination of hardware and software. And, the portion 106 is even more flexible and more functionally programmable than the portion 104 because it is implemented almost entirely in software. Further aspects of the present invention, in particular the modem 100, will be described in additional detail below.

II. Common Phase Accumulator.

An ADC converts a continuous time signal into a sequence of digital samples. The sampling rate is determined by the physical ADC sample clock. Conversely, a DAC converts a sequence of digital samples into a continuous time signal. The sampling rate of the digital samples is determined by the physical DAC sample clock. The underlying sampling rate of the incoming digital samples at a typical receiver (e.g., the signal 112 in FIG. 1) or the outgoing digital samples at the transmitter (e.g., the signal 114 in FIG. 1) can be altered by adjusting the physical ADC/DAC sample clocks. This approach can be expensive because it requires additional analog components. Instead, a more economical approach is to use digital resampling in the receive and transmit directions to properly re-sample/retime the receive samples from the ADC and the transmit samples sent to the DAC.

Digital re-samplers, such as the re-samplers 116 and 122 in FIG. 1, are digital filters that re-sample input signals by arbitrary rates and phase. In other words, the ratio of the input sample rate to the output sample rate need not be an exact ratio of integers. Their operation is controlled by two basic variables: phase increment and phase accumulator. The phase increment is a normalized time increment and is the ratio of the input sampling rate to the output sampling rate. The phase accumulator keeps track of the current time position (in normalized units).

In the receive direction, the combination of the ADC and the receive re-sampler 116 can effectively be viewed as an equivalent ADC whose sample rate is equal to the receive re-sampler output sample rate. Similarly, in the transmit direction, the combination of the transmit re-sampler 122 and the DAC can be viewed as an equivalent DAC whose input sample rate is equal to the transmit re-sampler input sample rate.

In an ADSL system, the ADSL transceiver unit remote terminal (ATUR) modem, derives an estimate of the ADSL transceiver unit-central office (ATUC) modem's symbol clock frequency and phase from the received signal. In the present invention, the modem 100 is the ATUR modem. The symbol clock derived by the ATUR is then used for both detection of the received signal as well as transmission of the upstream signal to the ATUC. The ATUC modem uses the same clock for both transmission and reception. This process is known as loop timing.

Since the ATUR transmitter timing is derived from the ATUR receiver, there must be a mechanism in place to ensure that the timing of the ATUR transmitter and receiver remains locked. It is extremely desirable that the timing between the transmitter and the receiver does not drift or skew. In conventional implementations, which use two re-samplers (one in the receive path and a second in the transmit path) to produce digital samples at the desired rate, it is difficult to ensure that timing will remain locked since each re-sampler uses its own independent phase accumulator (and phase increment). The use of a single phase accumulator will ensure that the timing of the re-samplers 116 and 122 remains locked. The single phase accumulator approach is implemented in the modem 100, as is described below in connection with FIG. 3.

Figure 3:
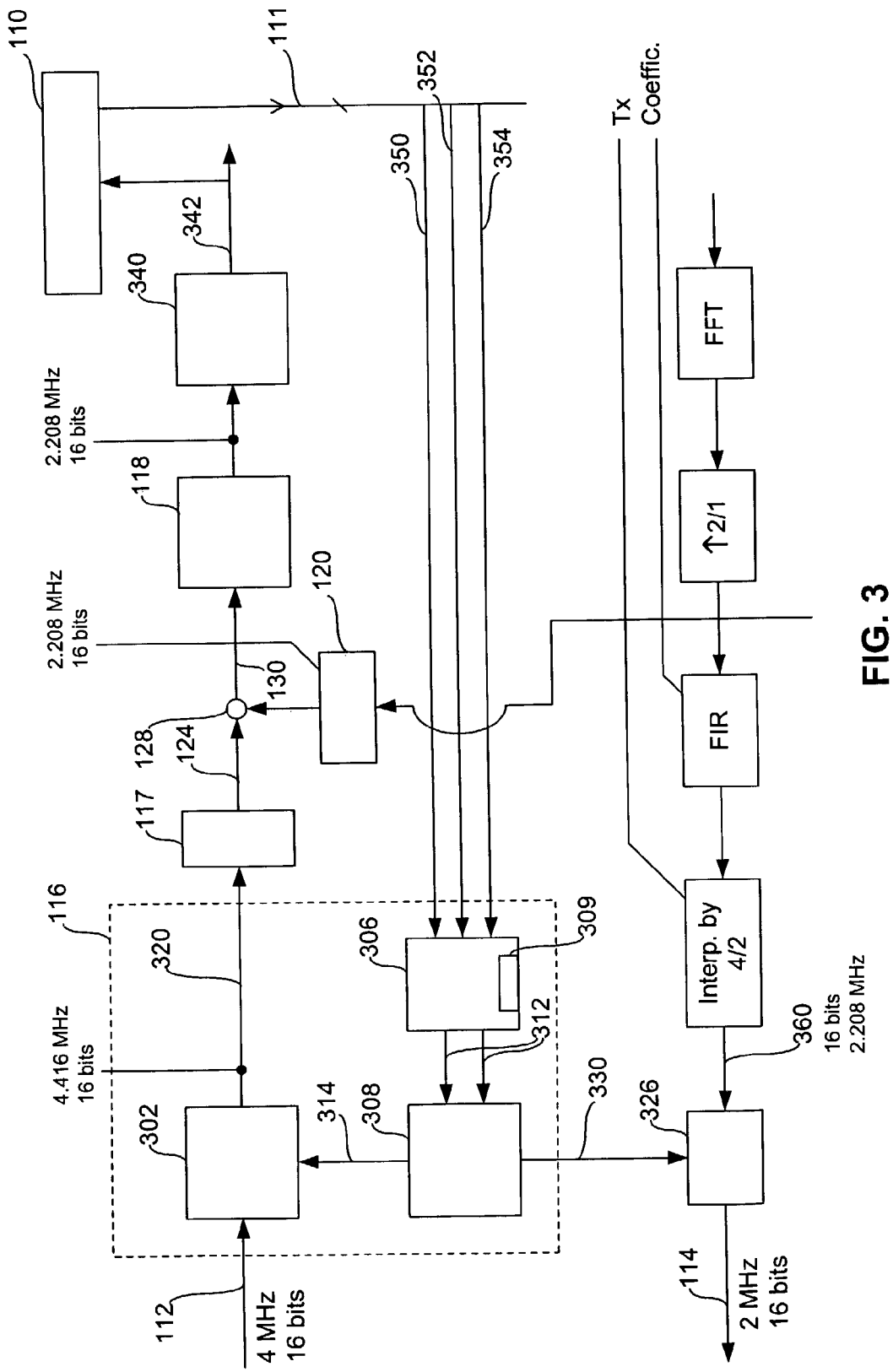
FIG. 3 is a block diagram further expanding on the block diagram of FIG. 1.

FIG. 3 is a block diagram that expands the illustration of the receive re-sampler 116, the transmit re-sampler 122, and the DMT 136, shown in FIG. 1. The receive re-sampler 116 includes the re-sampler 302 capable of up-sampling by a non-integer number and a re-sampler controller 306 coupled to a re-sampler coefficient generator 308. The re-sampler controller 306 includes a common phase accumulator register (i.e., phase accumulator) 309 that is shared between the receive re-sampler 116 and the transmit re-sampler 122.

Based upon inputs from the single phase accumulator 309, the re-sampler controller 306 produces re-sampler control signals 312. In response to the re-sampler control signals 312, the coefficient generator 308 provides a set of receive re-sampler coefficients 314 to the re-sampler 302. More specifically, the controller 306 uses the contents of the phase accumulator 309 to produce the correct coefficients 314 to be used for the computation of the current output sample of the interpolated signal 320.

The transmit re-sampler 122 includes a non-integer transmit re-sampler 326. In a manner similar to that described above, the re-sampler control signals 312, derived from the phase accumulator 309, prompt the coefficient generator 308 to produce updated transmit re-sampler coefficients 330 and to provide the coefficients 330 to the non-integer transmit re-sampler 326. In response, the transmit re-sampler 326 computes an output sample of the interpolated signal, i.e., the digitized transmit signal 114. The controller 306 performs a fixed mapping of the contents of the phase accumulator 309, prompting the coefficient generator 308 to produce the transmit coefficients 330. Thus, the single phase accumulator 309 ensures that the timing of the re-samplers 116 and 122 remains locked.

An FFT block 340, incorporated within the DMT 136, is also depicted in FIG. 3. Based upon the interpolated signal 320, the FFT module 340 produces a signal 342 and provides the signal 342 to the timing tracking modem control portion of the module 110. The timing tracking portion of the control module 110 provides the signals 111, including control signals and updated filter coefficients, to various modules within the portion 102 (AFE processor) of the modem 100.

In more specific terms, the timing tracking portion of the module 110 provides a phase increment signal 350, a phase tweak signal 352, and an out_bank_coeff_factor signal 354 to the re-sampler controller 306. These signals alter and/or act in accordance with the phase accumulator 309 and, therefore, ultimately control the phase values associated with the coefficients 314 and 330, produced by the coefficient generator 308. Thus, the single phase accumulator 309 provides mapping between the receive re-sampler 302 and the transmit re-sampler 326. This mapping provides perfect synchronized timing between the receive signal 112 and the transmit signal 114.

The modem 100 includes a receive signal timing recovery/tracking loop including the modules 302, 117, 128, 118, 310, 110, 306, 308, and 309 described above. The timing recovery loop recovers receive timing in the receive direction, and adjusts all or some of the signals 350, 352 and 354 to match the receive timing. Integral to the this operation is the use of the common phase accumulator 309 for both receive and transmit re-sampling timing control. The present invention, therefore, provides a type of one-to-one mapping between the receive re-sampler 116 and the transmit re-sampler 122 in order to update the common phase accumulator 309 within the timing recovery loop to achieve timing synchronization. The operation of the phase accumulator 309, in connection with control signals 111, and with reference to FIG. 3 is in greater detail below. It would be apparent to one skilled in the art that the implementation described below with some modification could be extended for other sample rates at the receive and transmit re-sampler inputs and outputs 112 320 360 114.

The following terms are defined in relation to the exemplary embodiments of FIGS. 1-3:

phaseAcc: phase accumulator
  The common phase accumulator 309 is a 32 bit register that acts as a modulo 32 bit counter. The phase accumulator 309 is updated by incrementing with the phase increment.

phaseInc: phase increment
  The phase increment 350 is 32 bit register. It represents the ratio of re-sampler 302 input sample rate to re-sampler 302 output sample rate expressed as a 32 bit integer with $2^{29}$ representing 1.0 normalized time unit (normalized by the re-sampler 302 input sampling period); in other words, nominally phaseInc is $$phaseInc = \mathrm{ROUND}\left(2^{29} \cdot \frac{4.0}{4.416}\right).$$

Before any timing information is available, the phase increment 350 is initialized with the nominal value of phaseInc given above. The phase increment is updated by the modem once the initial clock frequency error has been estimated. It would be apparent to one skilled in the art how this would be done.

bankFactor:
  The bankFactor is a 16 bit scale factor (1.15 format) used in the computation of the transmit re-sampler phase used to produce transmit re-sampler coefficients 330. The bankFactor is calculated as $$bankFactor = \mathrm{ROUND}\left(2^{15} \cdot \frac{1}{2 \cdot \phi}\right)$$

where $\phi$ is the ratio of re-sampler 302 input sample rate to re-sampler 302 output sample rate.

receive re-sampler 302 control variables

| | |
|---|---|
| bit29[n]: | (phaseAcc[31:0] & 0x20000000) >> 29 (for current phaseAcc) |
| bit29[n−1]: | (phaseAcc[31:0] & 0x20000000) >> 29 (for previous phaseAcc) |

These variables are used to detect the crossing of a 4.0 MHz boundary indicating a new input sample from the ADC must be pushed onto the re-sampler 302 delay line.

transmit re-sampler 122 control variables

| | |
|---|---|
| bit30[n]: | (phaseAcc[31:0] & 0x40000000) >> 30 (for current phaseAcc) |
| bit30[n−1]: | (phaseAcc[31:0] & 0x40000000) >> 30 (for previous phaseAcc) |

These variables are used to detect the crossing of a 2.0 MHz boundary indicating that a new output sample must be computed by the transmit re-sampler 122. The transmit re-sampler 122 processes the phaseAcc every second phase increment (ie., for every other value of the phaseAcc) and thus the meaning of current and previous in the above definitions should be understood in this context constants

| | | |
|---|---|---|
| nPhaseBits: | 4 | |
| nInterpBits: | 8 | /* used in linear interpolation */ |
| phaseShift: | (29 − nPhaseBits) = 25 | |
| nCoeffs: | 10 | /* number of coefficients per phase */ |

The coefficients 314 and 330 are derived from the same set of fixed coefficients as will be explained later. The fixed coefficients are extracted from a prototype filter and stored as 16 phases or banks (bank 0, 1, . . . , 15) with each bank containing 10 coefficients. One additional bank, bank 16, is also stored and is obtained from bank 0 by a circular shift of one sample. It would be apparent to one skilled in the art how bank 16 is generated. It would also be apparent to one skilled in the art that there are many different methods of generating coefficients 314 and 330.

constraints

| | |
|---|---|
| constraint: | phaseInc[31:0] < $2^{29}$ |

This constraint prevents the crossing of 2 successive 4.0 MHz boundaries with a single increment of the phase accumulator; i.e., this constraint ensures that the phaseAcc can not wrap twice mod $2^{29}$ with a single increment of the phase accumulator.

The receive re-sampler 116 computes bit29[n] for every value of phaseAcc. A wrap mod $2^{29}$ has occurred if the XOR of bit29[n] and bit29[n−1] is 1. This wrap signifies that a new input sample must be shifted into the re-sampler 302 delay line before the current output sample can be computed. The receive re-sampler 116 computes an output sample for every value of phaseAcc. The coefficients used to compute the output sample are obtained via linear interpolation as:

| | |
|---|---|
| rcvPhase[3:0] | = (phaseAcc[31:0] & 0x1fffffff) >> phaseShift |
| c0Ptr | = coeffPtr + (rcvPhase[3:0] * nCoeffs) |
| alpha[7:0] | = (phaseAcc[31:0] & 0x01fe0000) >> (phaseShift − nInterpBits) |
| c1Ptr | = c0Ptr + nCoeffs |
| coeffs[k] | = c0Ptr + ((c1Ptr[k] − c0Ptr[k]) * alpha[7:0]) >> nInterpBits |

NOTE:
coeffPtr is a pointer to the fixed set of 17 banks of coefficients.

The transmit re-sampler 122 operates in a similar fashion. The transmit re-sampler 122 computes bit30[n] for every other value of phaseAcc. A wrap mod $2^{30}$ has occurred if the XOR of bit30[n] and bit30[n−1] is 1. This signifies that a new output sample must be computed. The coefficients used to compute the output sample are obtained via linear interpolation as:

| | |
|---|---|
| tmp | = 0x20000000 − ((phaseAcc[31:0] & 0x3fffffff) >> 15) * bankFactor |
| tmp | = MAX([0, tmp]) |
| xmtPhaseTmp[4:0] | = tmp >> phaseShift |
| xmtPhase[3:0] | = LIMIT(xmtPhaseTmp[4:0], 0, 15) |
| alphaTmp[31:0] | = tmp − (xmtPhase[3:0] << phaseShift) |
| alpha[8:0] | = alphaTmp >> (phaseShift − nInterpBits) |
| c0Ptr | = coeffPtr + (xmtPhase[3:0] * nCoeffs) |
| c1Ptr | = c0Ptr + nCoeffs |
| coeffs[k] | = c0Ptr + ((c1Ptr[k] − c0Ptr[k]) * alpha[8:0]) >> nInterpBits |

Note:
coeffPtr is a pointer to the fixed set of 17 bank of coefficients.

The phaseInc and bankFactor parameters should be updated atomically in order to ensure that there are no glitches in the xmtPhase computation. A new input sample is shifted into transmit re-sampler 122 delay line with every other increment of the phase accumulator 309.

The ATUR receiver continuously extracts timing information from the received signal and updates the control signals 350 352 and 354 in order to track any clock drift that may occur in the system.

There are several different ways to update the timing of the re-samplers: 1) through use of a phase tweak (periodically adjust the phase accumulator), 2) through update of the phase increment, or 3) using a combination of 1) and 2). In the former case, the phase tweak is applied in conjunction with the phase increment when incrementing the phase accumulator 309. If Δ represents the adjustment to be applied to the phase accumulator 309, it is performed by using a phase tweak given by $$phaseTweak[31:0] = phaseInc\,[31:0] + \frac{\Delta}{2}$$

for 2 consecutive phase increments (the phase tweak acts as the phase increment for 2 consecutive phase increments). The phase tweak must be limited to be less than $2^{29}$ otherwise it would be possible to wrap twice modulo $2^{29}$ with a single increment of the phase accumulator 309. The use of the common phase accumulator 309 shared between the receive re-sampler 116 and transmit re-sampler 122 ensures that receive and transmit timing is locked.

III. Copying DMA With Two Separate Strides Selected by a Modulo-n Counter to Perform Convolutional De-interleaving.

In a communication system employing convolutional interleaving (such as an ADSL), it is necessary for the receiver to de-interleave the decoded data stream. A data buffer is used to implement the de-interleaving process. For each codeword-sized interleaved data block decoded and written into the data buffer, a single de-interleaved codeword is read from the data buffer. Because the data buffer requires substantial storage capacity, up to 16 KB for an ADSL system, it is desirable to share a single physical memory between the de-interleaving data buffer, other receiver system I/O buffers, and program and data storage. This type of shared memory architecture is known as a unified memory architecture (UMA).

The problem, however, with using traditional UMAs is that the codeword-sized blocks written to the de-interleaving data buffer are not an integer multiple of the width of the shared physical memory. This complicates the write interface to the shared memory by requiring it to perform alignment of the codeword-sized block and partial word writes in order to append the block to the existing data buffer contents. The second stride is also adjusted to account for a dummy byte added at the input to the interleaver (to make the interleaved block size relatively prime to the interleave depth) but not transmitted, as in systems like ADSL. The write interface is further complicated by the need to re-insert a dummy byte added at the input to the interleaver (to make the interleaved block size relatively prime to the interleave depth) but not transmitted. As a solution, the present invention uses a DMA scheme with two separate strides to copy codewords from the de-interleaving data buffer.

Figure 4:
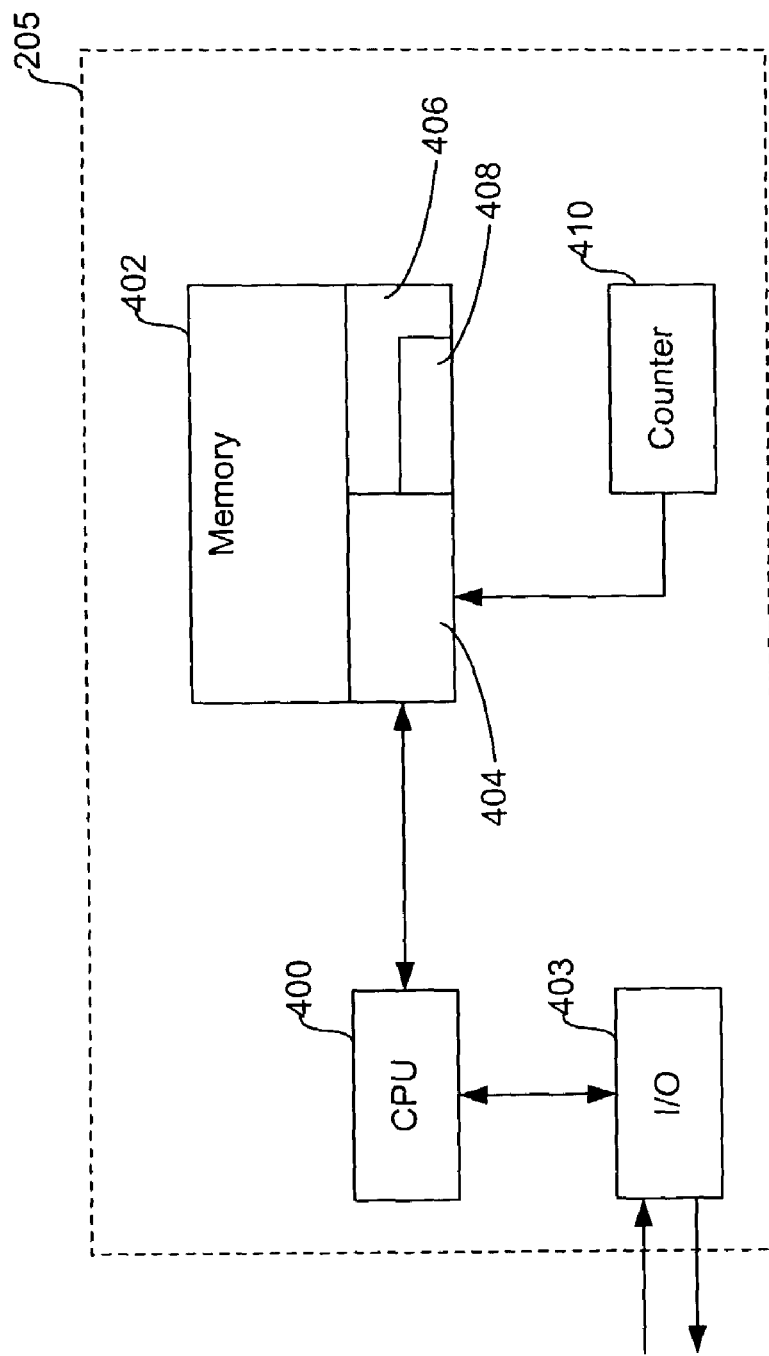
FIG. 4 is a more detailed view of the exemplary control processor shown in FIG. 2.

FIG. 4 is an illustration of a more detailed block diagram of the control processor 205, shown in FIG. 2. The control processor 205 is an example of a control processor, or DPS, suitable for implementing the DMA scheme of the present invention. In FIG. 4, the control processor 205 includes a central processing unit (CPU) 400, a memory 402, and an input/output interface 403. The DMA engine 404, responsible for implementing the DMA functions, includes a DMA memory storage area 406.

The DMA storage area 406 includes an exemplary de-interleaving data buffer 408, along with other DMA related storage locations. The DMA scheme is implemented using a DMA engine 404 to execute the overall DMA operations associated with the control processor 205. Thus, the DMA engine 404 receives data, via the control processor 205, based upon a received signal, such as the digitized signal 112. The received data is then placed into the data buffer 408 for de-interleaving. The data is read from the data buffer 408, or de-interleaved, in accordance with the DMA engine 404, selected DMA parameters (discussed in greater detail below), and a modulo counting scheme. The modulo counting scheme is accomplished using an exemplary modulo counter 410.

In the present invention, the use of two separate strides, for placing the data into the data buffer 408 allows the codeword-sized blocks, written to the buffer, to be appended with dummy bytes. This padding enables the codeword sized blocks to be translated to a size, or format, that is an integer multiple of the shared physical memory width. The size conversion simplifies the write interface by eliminating the need for data alignment and partial word writes into the shared memory.

The first stride specifies the increment between codeword elements necessary to perform the basic de-interleaving operation. The second stride allows the DMA engine 404 to skip over the dummy padding every codeword-size bytes. The wrapping of a modulo-n counter indicates when the second stride should be used to perform the skip.

Figure 5:
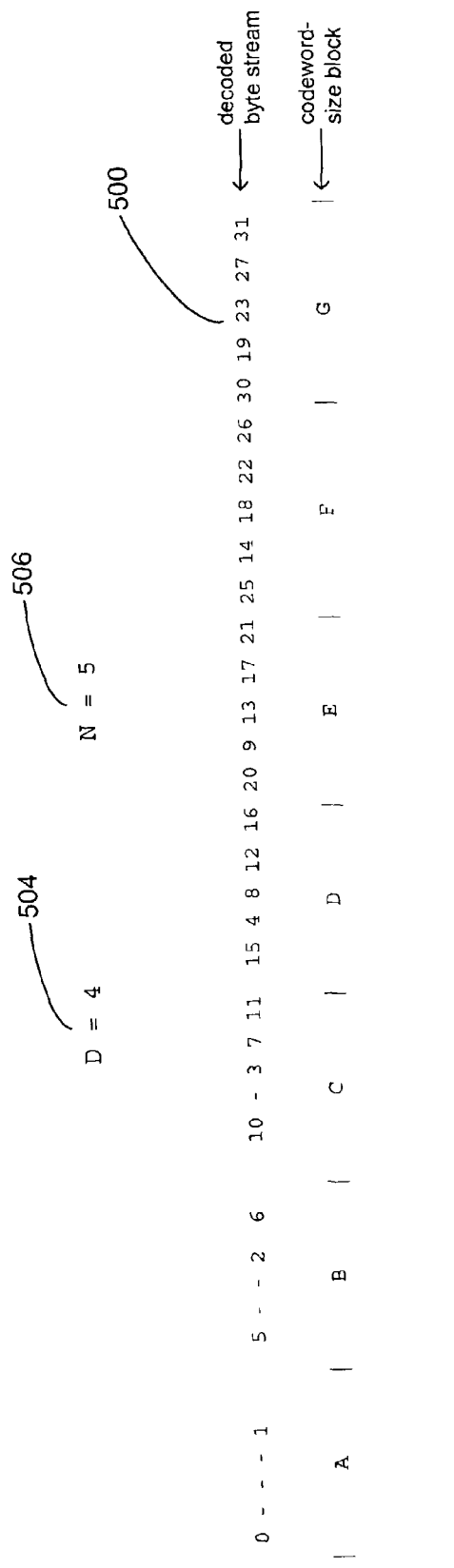
FIG. 5 is an exemplary illustration of a decoded byte stream.

FIG. 5 is an illustration of an exemplary decoded serial byte stream 500, segmented into codeword-sized data blocks A-G. The byte stream 500 includes a plurality of individual interleaved bytes, as shown, and is representative of a typical byte stream received as an input to the CPU 400 and processed by the DMA engine 404. Such byte streams are normally interleaved on the transmitter side in order to provide features such as robustness and security and thus require de-interleaving at the receiver side.

Figure 6:
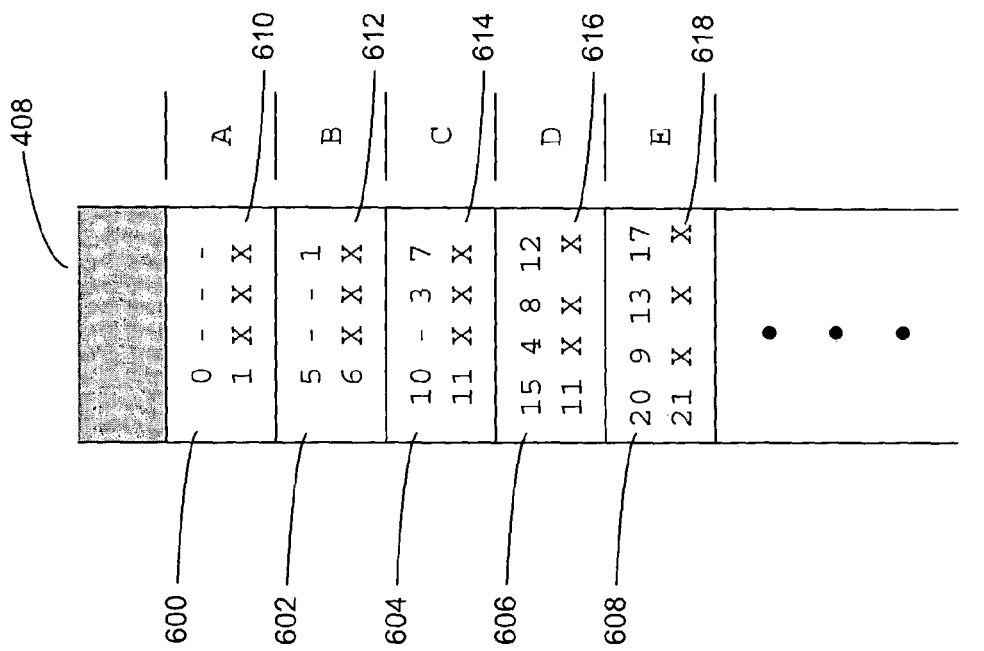
FIG. 6 is an illustration of an exemplary memory buffer configured to receive the data stream of FIG. 5 in accordance with an embodiment of the present invention.

In the example of FIG. 5, and for purposes of illustration only, the byte stream 500 has a de-interleave depth (D) of "4" and a block size value (N) of "5." The de-interleave depth (D) controls the amount of time each byte is delayed. The block size value (N) specifies the number of bytes in each codeword. Thus, in the example of the byte stream 500, each of the individual bytes is delayed by four time slots. In the present invention, the DMA engine 404 is configured to efficiently place the originally transmitted bytes of the data stream 500 back into their original order (1, 2, 3, 4, 5, 6 . . .) instead of the interleaved order (0-,-,-, 1, 5, etc.), illustrated in FIG. 5. FIG. 6 illustrates the first step in the process of re-ordering the bytes of the data stream 500, i.e., copying each of the codeword-size blocks A-G into the data buffer 408.

In FIG. 6 the input buffer 408, shown vertically arrayed, is partitioned into separate memory locations 600-608. Fort purposes of illustration, the memory locations 600-608 correspond to the exemplary data blocks A-E. In the example of FIG. 6, each of the memory locations 600-608 has a memory width (W) of four bytes. The DMA engine 404 must respectively copy the codeword-size data blocks A-E into the memory locations 600-608. In a first stage of de-interleaving the byte stream 500, the DMA engine 404 writes the first block A, is indexed 0,-,-,-, 1, into the memory location 600 in the manner illustrated in FIG. 6.

A common requirement on many different types of memories is that data must be written to the memory in integer multiples of the memory width (W). Although exceptions to this requirement are possible, the exceptions provide inefficient, overly complex schemes that sacrifice speed and power and erode other valuable system resources. Therefore, in the present invention, the DMA engine 404 will copy the five bytes of the data block A, and all of the other five byte codeword-size blocks B-G, into the buffer 408 in multiples of four bytes at a time.

Since the data blocks A-E are five bytes in width, and thus not a multiple of the memory width (W) of four bytes, the data blocks A-G must be appended, or padded, with three dummy padding bytes 610-618 respectively. This padding artificially converts the length of each of the blocks A-E to eight bytes, a multiple of the memory width (W) four. With all of the exemplary data blocks A-E, including the appended padding bytes 610-618, now having been stored in the respective memory locations 600-608, the DMA engine 404 must now perform the de-interleaving.

FIG. 7 is an illustration of essential parameters used by the DMA engine 404 to de-interleave the now padded data blocks A-E, stored in the memory locations 600-608 of the buffer 408. The DMA parameters shown in FIG. 7 are typically stored in DMA registers or storage areas, such as the DMA memory storage area 406. As noted above with reference to FIGS. 5 and 6, the byte stream 500 and the DMA parameters of FIG. 7 are for the exemplary case where the interleave depth (D) is 4 and the byte size (N) is 5. traditional DMA engines use many other DMA parameters to perform de-interleaving. The present invention also uses some of these other DMA parameters. For purposes of clarity, however, the present application will not address these other parameters since their use remains unchanged in the present invention. Instead, the description of the present invention will focus on the DMA parameters shown in FIG. 7.

The STRIDE is the first of the DMA parameters listed in FIG. 7, and is has a value of 4. In the present invention, the STRIDE is the distance from one byte, that requires copying to memory, to the next byte requiring copying. STRIDE2, with a value of 4+3, is similar to the STRIDE, plus the number of padding bytes, such as the three bytes of padding 610 stored in the memory location 600. Thus, in the case of STRIDE 2, the DMA engine will skip over the padding bytes 610 in addition to the interleave depth. The number of padding bytes is referred to as the PADSIZE.

In the example of FIGS. 6 and 7, the STRIDE increments through all of the values of the block A (0,-,-,-, and 1) to obtain the value "1." And the "3" in the STRIDE2 implies skipping over the "5" and the two dashes that follow the "5" of the block B, to get to the "2" value of the block B. Also included in the DMA parameters are the values of OFFSET, OFFSET INC, and OFFSET MOD, discussed in greater detail below.

The following is an exemplary approach to initializing the DMA parameters shown in FIG. 7 of the instant invention:

```
stride      = floor(D / N) * (N + PADSIZE) + (D mod N)
stride2     = stride + PADSIZE
offset      = 0
offsetInc   = D mod N
offsetMod   = N
where D is interleave depth
    N is interleave length (i.e. including any pre-interleave padding)
    PADSIZE is number of padding bytes per codeword (including any
pre-interleave padding not transmitted which is negative)
    The DMA computes each address to copy from as follows:
    offset += offsetInc
    if (offset >= offsetMod) then
        offset -= offsetMod
        address += stride2
    else
        address += stride
```

FIG. 8 is an illustration of an exemplary DMA address sequence for determining the order in which the de-interleaved data bytes of the blocks A-E are read from the buffer 408. In FIG. 8, step 0 represents the reading of address A, which is the beginning of the buffer 408, where the bytes are numbered from left to right. Thus, the DMA engine 404 will first read the value "0" at address A. Address A corresponds to the first byte of the first row of the memory location 600 of the buffer 408. Next, in step 1, the DMA engine 404 will increment the address by the STRIDE value of "4." Thus, address A+4 of the buffer 408 will be read, which contains the value "1." The address A+4 corresponds to the first byte of the second row of the memory location 600.

In step 2 of FIG. 8, the STRIDE2 of FIG. 7 will be used instead of the STRIDE, which represents an increment of 7. Thus, the DMA engine 404 will skip over 7 values to obtain the value of "2," shown in byte position four of the memory location 602. The DMA engine 404 will continue to read the remaining contents of the memory locations 602-608 to finally produce a de-interleaved byte stream sequenced as 0,1,2,3,4,5 . . . .

In any particular read cycle, the DMA engine 404 will use STRIDE or STRIDE2, but not both at the same time. Thus, the DMA engine 404 must know apriorily whether to use STRIDE or STRIDE2. The values of the OFFSET column of FIG. 8 determine whether the DMA engine 404 will use STRIDE or STRIDE2. The values of the OFFSET column operate based upon a modulo-n counting scheme. The modulo-n counting scheme controls the OFFSET, OFFSET INC, and OFFSET MOD (the modulo of how the offset of FIG. 8 is incremented) of the DMA parameters shown in FIG. 7.

The offset of FIG. 8 initially begins at 0, and for each step, is incremented by the OFFSET INC value. If the offset is initially 0, it will ordinarily be incremented by 4 each time. However, the offset counts by modulo. Therefore, in the example of FIGS. 5-8, the only legal numerical values are 0-4, since the present example is based on modulo-5. The OFFSET MOD value corresponds to the byte size (N). Thus, in FIG. 8 at step 0, the offset is 0, and then the DMA engine 404 increments by 4. In step 1, the offset is 4. In step 2, the DMA engine 404 increments by 4 again, and so it would ordinarily be 8. The value, however, gets reduced because the counting is based on modulo-5, which in-turn, produces the offset value of 3. The remaining values of the offset column of FIG. 8 are determined in this manner and this process continues until the entire byte stream 500 is completely de-interleaved.

Thus, in accordance with the present invention, the DMA engine 404 uses two strides to facilitate an efficient implementation of a UMA memory technique. This technique ensures that codeword-size data blocks can be written into memories in cases where the originally transmitted data blocks are not an integer multiple of the width (W) of the input buffer memory. In so doing, this process eliminates the need to perform alignment and partial word writes of the data blocks, which provides significant savings of system resources.

IV. Conditional One's-complement of Partial Address to Map Butterfly Address Generation to FFT/IFFT Post-/Preprocessing Pass Address Generation.

Processors, such as the control processor 205 of FIG. 2, support FFT/IFFT functions through use of standard radix-2 butterfly operations. These butterfly operations are specific implementations of an FFT algorithm in cases where the number of input samples is a power of 2. In order to implement these FFT/IFFT functions, the processor 205 includes address generation logic to access the input and output operand pairs (address pairs) of each butterfly.

One way of generating the butterfly input and output address pairs is to use a pointer and a fixed offset to access the operands at addresses 'pointer' and 'pointer+offset', incrementing the pointer through each recursion in the FFT/IFFT stage. A preferred approach would be to support optimized implementations of the FFTI/IFFT for real-valued FFT inputs and IFFT outputs using standard post and pre-processing steps. Using standard post and pre-processing steps, however, the inputs to the butterfly operations of the post- and pre-processing steps are not separated by a fixed offset, and thus cannot use the normal operand addressing logic.

As a solution, the present invention uses an exemplary circuit implementation to conditionally invert the n−1 least-significant bits (LSBs) of the butterfly operand addresses provided for an N-point FFT/IFFT, where N=2^n. The n−1 LSBs are inverted when the n'th operand address bit (address [n−1] where the LSB is address[0]) is 1, otherwise the LSBs are unchanged. This effectively reverses the last N/2 inputs to the real-valued FFF post-processing pass or IFFT pre-processing pass, yielding un-unfixed offset between the inputs to the butterfly operations of the pass.

FIG. 9 is an illustration of a conventional 512 point FFT implementation 900. In FIG. 9, pairs of 512 real-valued inputs 902 are represented in the form of a 256 point (preprocessing) complex FFT 904. Using a traditional FFT approach, the 256 point complex FFT values are processed in the stage 904. Next, a conventional FFT post-processing stage 906 is implemented to produce 256 complex outputs 908. FIGS. 10 and 11 provide more detailed illustrations of the complex FFT operation 904 and the FFT post-processing stage 906.

In FIG. 10, a complex FFT operation, such as the pre-processing FFY operation 904, is implemented using a standard radix-2 butterfly 1000. A butterfly is a computational technique that takes a pair of real-valued FFT inputs and produces a pair of complex outputs. While the FFT operation 904 of FIG. 9 is a 256 point FFT, for purposes of simplification, the butterfly technique 1000 is demonstrated using an 8 point FFT.

In the illustration of FIG. 10, 8 complex value inputs 1002 (representative of 16 real-valued inputs) are provided as inputs to the butterfly 910. Outputs 1004 of the butterfly 1000 are represented as output addresses B0-B3. The output address B0 is associated with complex value inputs 0 and 4, which are provided as inputs to a first butterfly calculation (of the butterfly 1000). The output address B1 is associated with inputs 1 and 5, which were provided as inputs to a second butterfly calculation, the address B2 is associated with inputs 2 and 6, and so on, as illustrated in the step/address table 1006, also shown in FIG. 10. A point of interest with regard to the output addresses B0-B3, is that distances 1008-1012 (or offsets) between the addresses B0-B3 are fixed, with respect to each of the butterfly calculations of the butterfly 1000.

In FIG. 11, a standard post-processing operation, such as the post-processing operation 906, is implemented using a butterfly 1100. The butterfly 1100 receives inputs pairs 1102 and produces outputs 1104, shown as addresses C0-C2. In the post-processing butterfly 1100, however, offsets 1106-1110, associated with the inputs 1102, are not fixed. That is, the offsets 1106-1110 decrease in length for each of the butterfly calculations associated with the butterfly 1100. In an exemplary embodiment of the present invention, FFT pre-processing output addresses having fixed offsets, such as the exemplary addresses B0-B3, are transformed into FFT post-processing addresses having decreasing offsets, such as the exemplary addresses C0-C2.

Figure 12:
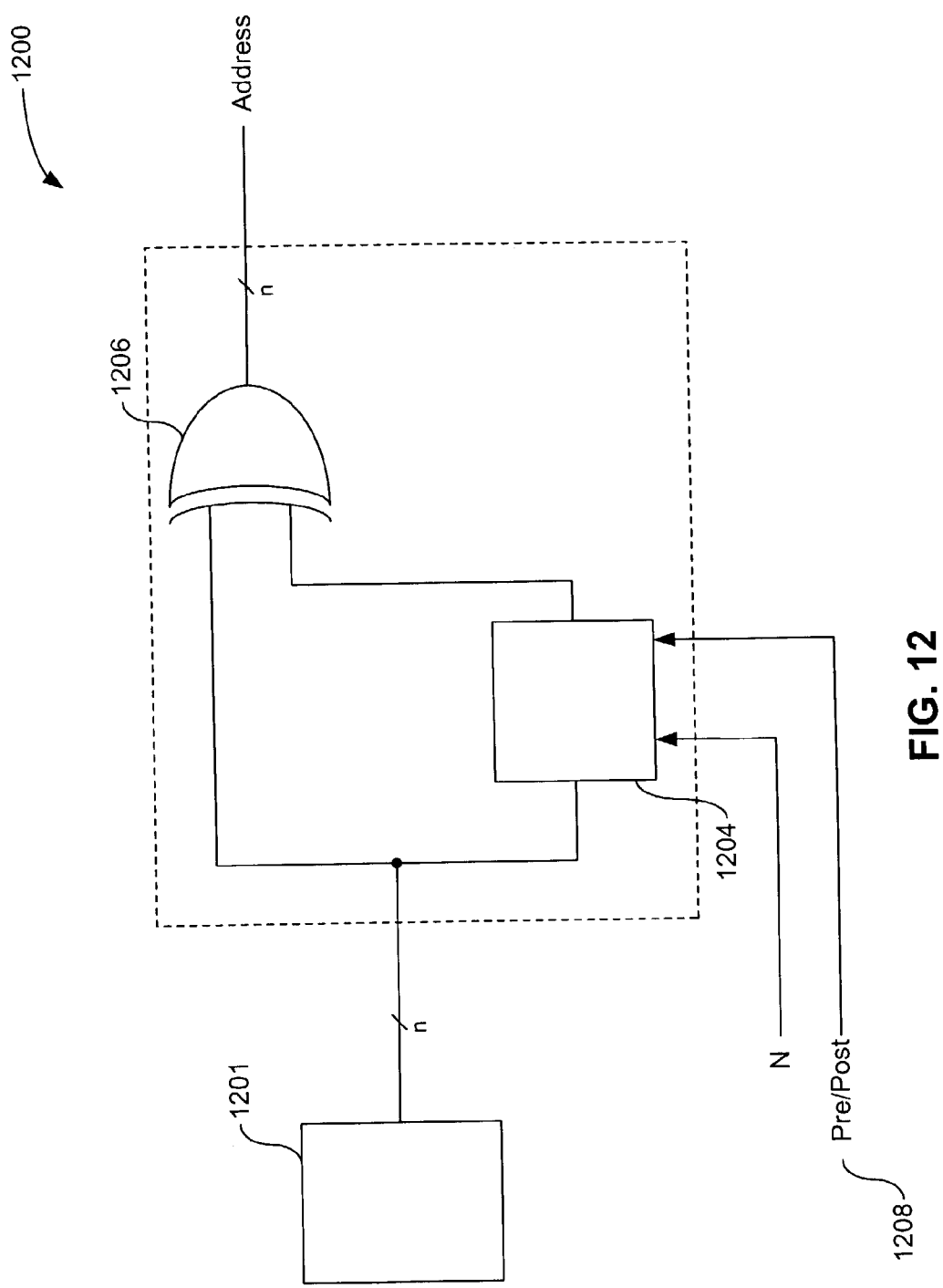
FIG. 12 is a block diagram illustration of an exemplary circuit configured in accordance with an embodiment of the present invention.

FIG. 12 is a block diagram illustration of an exemplary circuit 1200 be configurable to transform the addresses output from an FFT pre-processing stage into addresses representative of an FFT post-processing stage. The circuit 1200 can be inserted into the logic path of a DSP controller, such as the controller 205 of FIG. 2, to perform this address transformation.

The circuit 1200 is coupled to an output of a conventional FFT address generator 1201. The address generator 1201 is included as part of an FFT intermediate processing FFT algorithm, such as the operation 904, and produces FFT complex values, such as those that would be provided to the post-processing operation 906. At a high level, the circuit 1200 is configured to perform a conditional one's complement of the address output from the address generator 1201.

The circuit 1200 includes a mask generator 1204 and a logic gate 1206 configured to perform a complementing operation. In the embodiment of FIG. 12, the logic gate is an exclusive OR gate, although other suitable logic circuits can be used. A value (n) specifies the number of address lines or bits output from the FFT address generator 1201. Another value (N) represents the size of the FET operation to be performed, such as 256 point or 512 points, and is provided as an input to the mask generator 1204.

The mask generator 1204 allows the circuit 1200 to function with FFTs of different sizes. The mask generator 1204 also determines how many of the bits, output from the address generator 1201, should be complemented. A pre/post processing enabling signal 1208 is provided as input to the mask generator 1204. The signal 1208 enables the circuit 1200 when an FFT computation reaches the post-processing stage 906. The function of the circuit 1200 is explained in greater detail below, in relation to FIG. 13.

Figure 13:
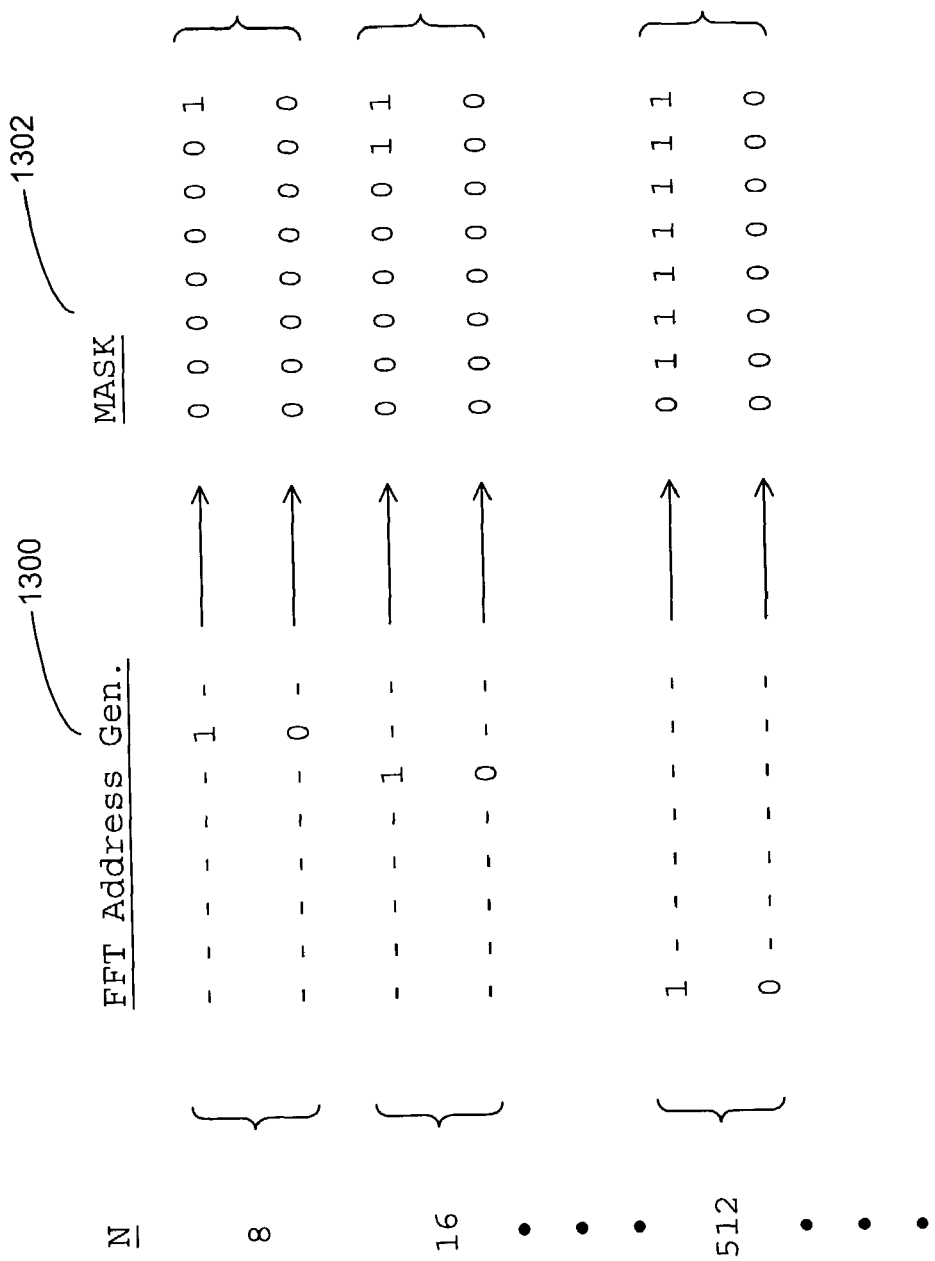
FIG. 13 is an illustration of data generation associated with the circuit of FIG. 12.

FIG. 13 is a detailed illustration of exemplary outputs 1300 of the FFT generator 1201. FIG. 13 also illustrates exemplary masks 1302. Each row of the masks 1302 is associated with a corresponding one of the rows of the outputs 1300, as indicated by the arrows. As noted above, the value (N) specifies the size of the FFT operation to be implemented. The example of FIG. 10, where (N) is 8, corresponds to the first two rows of the outputs 1300. An (N) value of 16 corresponds to the third and fourth rows of the addresses 1300 and masks 1302. In the example where (N) is 8, there is only one bit of the FFT generator 1201 that will control one of two output values of its corresponding mask within the mask values 1302.

When the signal 1208 indicates that the FFT post-processing is occurring, the mask generator 1204 is enabled. The output of the mask generator 1204 is then exclusively OR'd with the addresses having fixed offsets, output from the address generator 1201. The output of the circuit 1200 is a conditionally inverted address sequence having decreasing outputs, as discussed above. FIG. 14 is a more detailed illustration of the output of the circuit 1200.

In FIG. 14, steps 2-255 are shown, each corresponding to one of the addresses within an address sequence 1402. The address sequence 1402 is provided as an output from the address generator 1201 and includes fixed offsets (1/128, 2/129, 3/130, etc.). The circuit 1200, however, transforms the address sequence 1402, as described above, into the address sequence 1404 having decreasing offsets (1/255, 2/254, 3/254, etc).

The present invention, therefore, provides significant economies by enabling the calculation of the post-processing FFT address sequence directly from the output of the FFT address generator 1201. This calculation is achieved through the use of simple logic circuit that performs a one's complement of the fixed offset addresses and a mask of the address. Thus, the techniques of the present invention facilitate savings of significant hardware resources that would ordinarily be dedicated to performing FFT post processing address.

V. Definition and Implementation of SLICE Instructions on a Programmable SIMD Processor Data Path.

An important function in digital communication receivers is the 'slicing' of a received data symbol to determine the nearest point (or phase state) on a constellation grid. That is, the digital communication receivers must be able to closet grid point, from a standpoint of distance, that a particular received symbol value is associated with when it was transmitted. Put more simply, the receiver use slicing to determine precisely what was originally transmitted.

One commonly used approach to perform slicing in a DSP is through execution of a sequence of conventional instructions. The slicing function can also be implemented in dedicated logic, but this approach is inflexible and requires additional hardware resources. Dedicated logic, however, is unnecessary in systems where data paths of a SIMD based programmable DSP, such as the controller 205 of FIG. 2, can be modified to perform the slicing functions.

The instant invention provides an approach for slicing operations to be more efficiently and supported directly on a programmable DSP. This more efficient approach is facilitated through extensions to the instruction set, modifications to internal data paths, and use of control logic. The slicing operations are implemented using the data path logic that is provided for other basic operations.

DSPs typically provide functional units for multiplication, addition (accumulation) and result scaling. Many DSPs provide multiple sets of such units, controlled with a SIMD scheme to enhance performance. Slicing can be efficiently implemented using pairs of such units processing the in-phase and quadrature phase (I and Q) components of a received symbol. A more detailed discussion of preferred embodiments of the present invention is provided below in relation to a description of FIGS. 15-20.

FIG. 15 is a block diagram illustration of a conventional three stage DSP functional SIMD based data module 1500, having first and second parallel paths 1502 and 1504. Since the first and second data paths 1502 and 1504 include identical functional modules, the discussion of the first parallel path 1502 will apply equally to the parallel path 1504. The conventional data module 1500 includes a first pipeline stage 1506 including a multiplier 1507, a second pipeline stage 1508 including an adder 1509, and a third stage 1510 including a scalar 1511. Also included are registers 1512 for holding addresses or instructions used for manipulation of data passed through each of the stages of the data module 1500.

In the conventional functional data module 1500 illustrated in FIG. 15, input operands OP1n and OP2n are received, from general registers, as inputs to the stage 1506 of the first path 1502 during a current timing cycle. The input operand OP1n might, for example, be representative of the "I" component of a received data point in the exemplary form of a 16 bit data word. The operand OP2n is traditionally representative of a scaling factor. The operands OP1n and OP2n are multiplied together in the multiplier 1507.

Next, the product of the multiplier 1507 is provided to the input of the adder 1509 in accordance with, for example, instructions stored in one of the registers 1512. In the module 1500, the second data path 1504 is configured to receive symbol data associated with the symbol's "Q" component, as discussed above. Further, while the first stage 1506 process the input from the current timing cycle, the stage 1508 is simultaneously processing an input from a previous timing cycle and the stage 1510 is simultaneously processing an input from an even earlier timing cycle.

A rounding value, provided as an input to a mutiplexer 1514, is added to the first product of the multiplier 1507 during the noted timing cycle. For subsequent products output from the multiplier 1507, the multiplexer 1514 selects its lower path such that the products are added with previous sums. A rounding value is provided so that when scaling is performed in the third stage 1510, the scaling will be performed on a sum having a fixed number of data bits.

Figure 16:
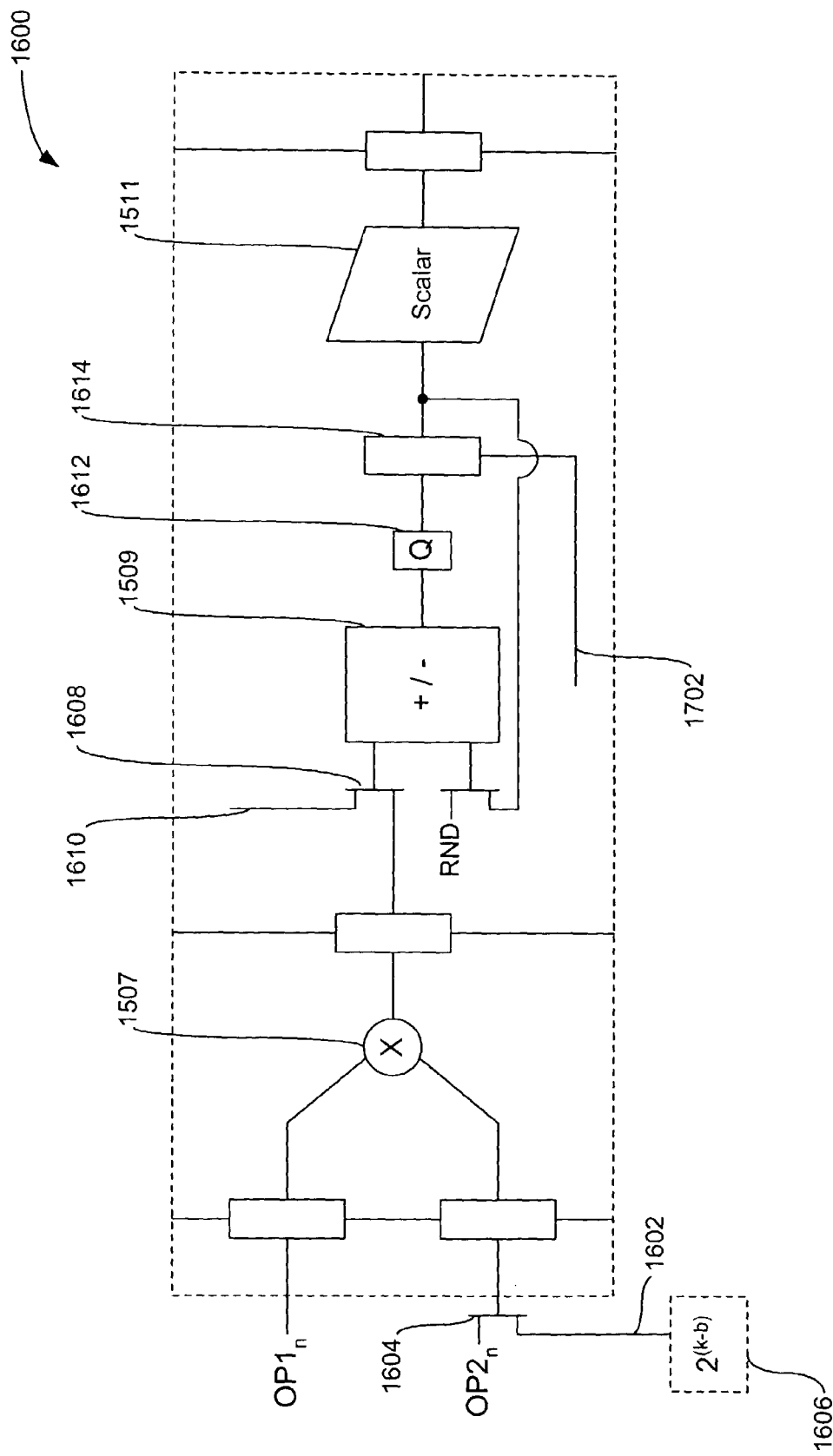
FIG. 16 is a block diagram illustration of modifications to the illustration of FIG. 15 in accordance with an embodiment of the present invention.

Next, the result from the adder 1509 is scaled in the third stage 1510 by a scalar 1511. The scalar 1511 multiplies the result, output from the adder 1509, times $2^{(-k)}$, where (k) is specified by the DSP instructions. The output of the scalar 1511, labeled as RSLTn, is then provided as an overall output of the data module 1500. As previously noted, FIG. 15 is an illustration of a conventional SIMD processor data path. FIG. 16, however, is an illustration of modifications, in accordance with the present invention, to the conventional data path of FIG. 15. This modification enables the data path to more efficiently support symbol slicing instructions.

In general terms, FIG. 16 provides a block diagram illustration of an exemplary data path module 1600 capable of performing symbol slicing instructions as part of its instruction set, i.e., performing the slice instruction as a primitive instruction. An advantage of the approach of the present invention is a reduction in the number of input cycles required to execute slice instructions. In a conventional DSP, slice instructions can require 20 or more cycles for execution. In the exemplary embodiment of FIG. 16, however, slice instructions can be executed within about two cycles.

More specifically, FIG. 16 includes a data path module 1600 including conventional components, such as the multiplier 1507, the adder 1509, and the scalar 1511, shown in FIG. 15. The module 1600, however, also includes an additional operand path 1602 and an additional multiplexer 1604.

A constants generator 1606 is provided to scale the bit stream associated with OP1 (the I or Q component) into a format that has its binary point in a fixed position. The scaling directly supports the slicing function and scales each of the I and Q components to a fixed format by multiplying OP1 by $2^{(k-b)}$, where k is a constant chosen based on the data path precision and b, an instruction parameter or operand, indicates the number of fractional bits in, for example, the 16 bit data stream of the I or Q component.

When control logic of the DSP detects that the data module 1600 is executing a slicing instruction instead of standard DSP instructions, the multiplexer 1604 selects its operand path 1602 (lower path). When the path 1602 is selected, OP1 is received and is multiplied by the expression $2^{(k-b)}$ and is thus scaled into the fixed binary point format. The use of a fixed format simplifies subsequent processing.

Next, OP1n and the fixed format value (output from the constants generator 1606) are multiplied together in the multiplier 1507. The product of the multiplier 1507 is provided as an input to another multiplexer 1608. Also provided as an input to the multiplexer, are boundary constraints 1610 which are output from a slice decoder 1700, illustrated in FIG. 17. The slice decoder 1700 and the boundary constraints 1610 are discussed in greater detail below and in relation to FIG. 17.

Figure 17:
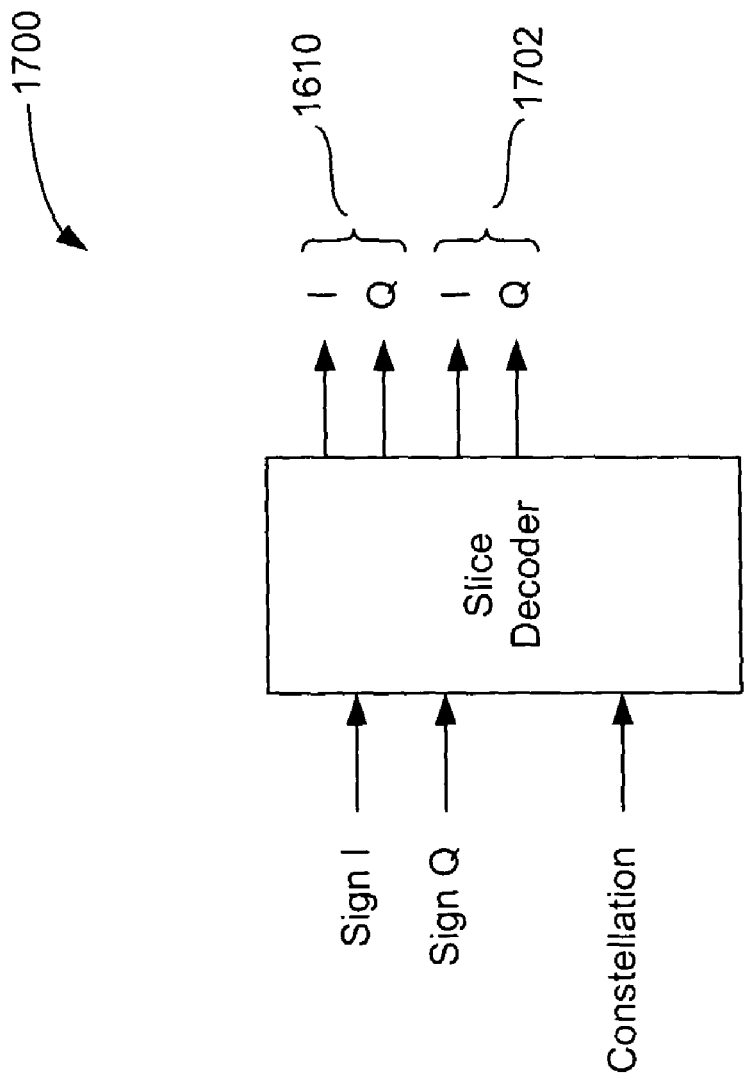
FIG. 17 is an illustration of an exemplary slice decoder used in the system of FIG. 16.

FIG. 17 is an illustration of an exemplary slice decoder 1700. The slice decoder 1700 is conventional logic that is configured to receive the sign bits of the I and I components associated with the received symbol data. The decoder 1700 also receives data representative of the particular constellation grid associated with the transmitted symbol data. The output of the decoder 1700 is a set of I and Q limit values 1610 (boundary constraints) and a set of I and Q load enable conditions 1702. The limit values 1610 and the enable conditions 1702 are a function of the location of the received symbol on a particular constellation grid, such as the grid shown in FIG. 18.

Figure 18:
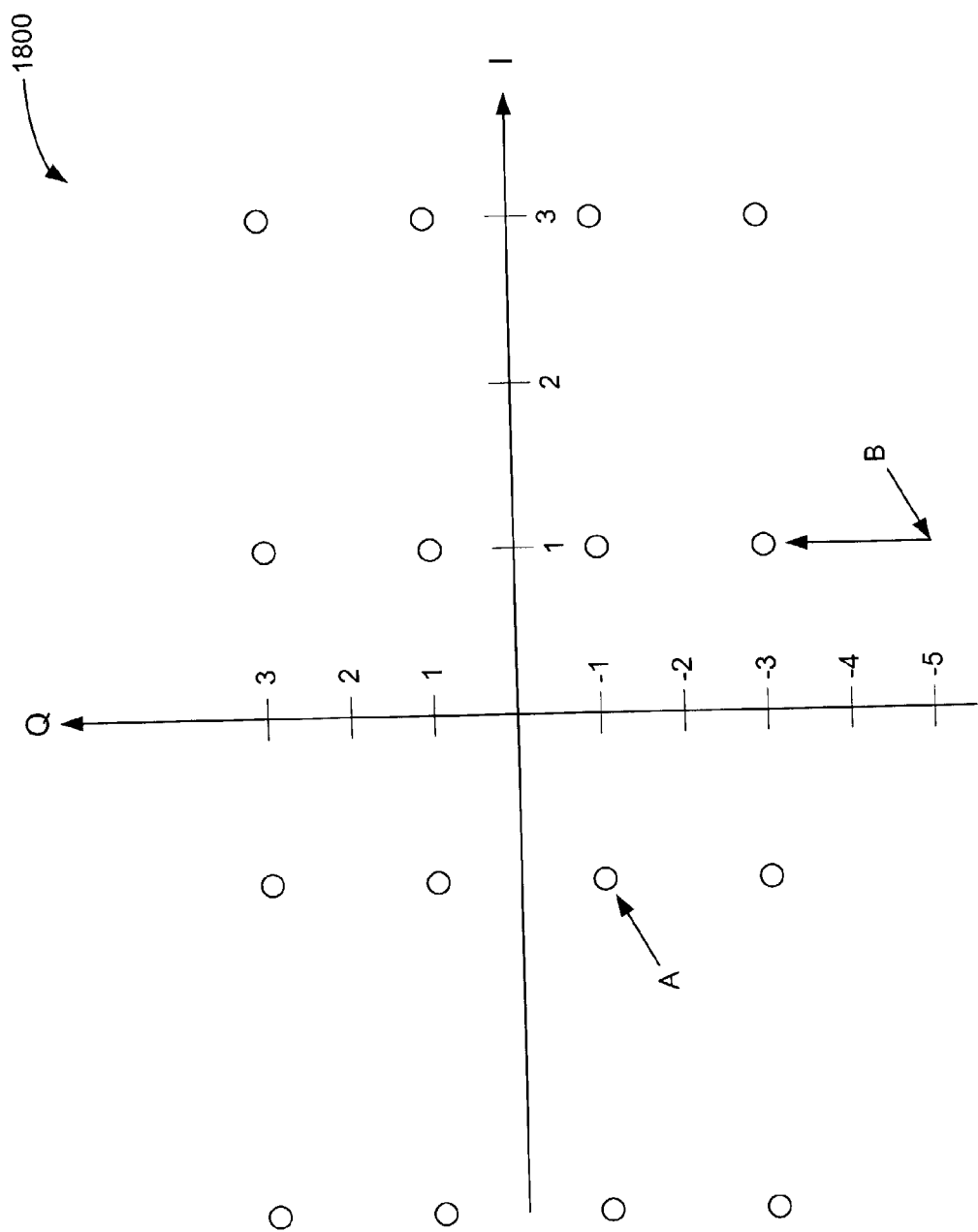
FIG. 18 is a graphical representation of an exemplary constellation grid used in an embodiment of the present invention.

FIG. 18 is a graph of a conventional 4×4 constellation grid 1800. Constellation grids are representative of accepted communications standards and include two-dimensional displays of the baseband I and Q values of transmitted and received data symbols, as measured at a particular point in time. A vector from the center of the diagram to a specific constellation point is representative of the amplitude of the symbol. When symbol data is originally transmitted, its I and Q components have specific coordinates within a constellation grid. Due to noise, transmission error, and other factors, the symbol's receive constellation grid values often differ from its transmission constellation grid values. As noted above, the present invention is an efficient technique to determine the original transmitted constellation grid values of the originally transmitted data symbol.

Although the constellation grid of FIG. 18 is a 4×4 representation, the present invention can operate with constellation grids of other sizes, such as 2×2, 8×8, or diagrams that are not square. In FIG. 18, the points "A" an "B" are representative of the I and Q components of bits that combine to form a transmitted data symbol. When the points "A" and "B" were originally transmitted, they were associated with specific coordinates, or points, on the grid 1800. During transmission, however, the points moved off of their original grid coordinates as shown.

Therefore, the DSP, using instructions within the data module 1600, must slice the received symbol data to determine which of the coordinates on the grid that the points "A" and "B" were originally transmitted on. With reference to FIG. 17, the limit values 1610 are representative of the limits of the I and Q axis of the grid. In the exemplary grid 1800, the limits of the I axis are +3 and −3, and the limits of the Q axis are also +3 and −3. These limits define a ring of grid points. The I and Q conditions 1702, on the other hand, are associated with whether the "A" and "B" points are actually within the ring of points.

Referring back to FIG. 16, the product of the multiplier 1507 is representative of an actual I or Q component of one of the A and B points. This product is received as an input to the multiplexer 1608. The multiplexer 1608 then alternately provides the product of the multiplier 1507 and the I and Q limit values 1610 to the adder 1509, which in the present invention, is used as a comparator. The output of the adder 1509 is used to determine whether the points A and B are within the ring of I and Q points (finite grid) or outside the ring of points (infinite grid). As seen in FIG. 18, A is within the ring of points and B is outside.

The output of the adder 1509 is provided as an input to a quantizer circuit 1612. The quantizer circuit 1612 essentially forces the points A and B to the nearest point on the infinite grid. Subsequent cycles use the adders to implement boundary clamping via per-quadrant min/max operations that conditionally load the result registers (accumulators) based on comparisons performed by the adders (with possible auxiliary comparisons). The constants can be read from a table indexed by an instruction operand or directly specified by the operand. Additional details of the circuit 1612 are provided in the discussion concerning FIG. 19.

Figure 19:
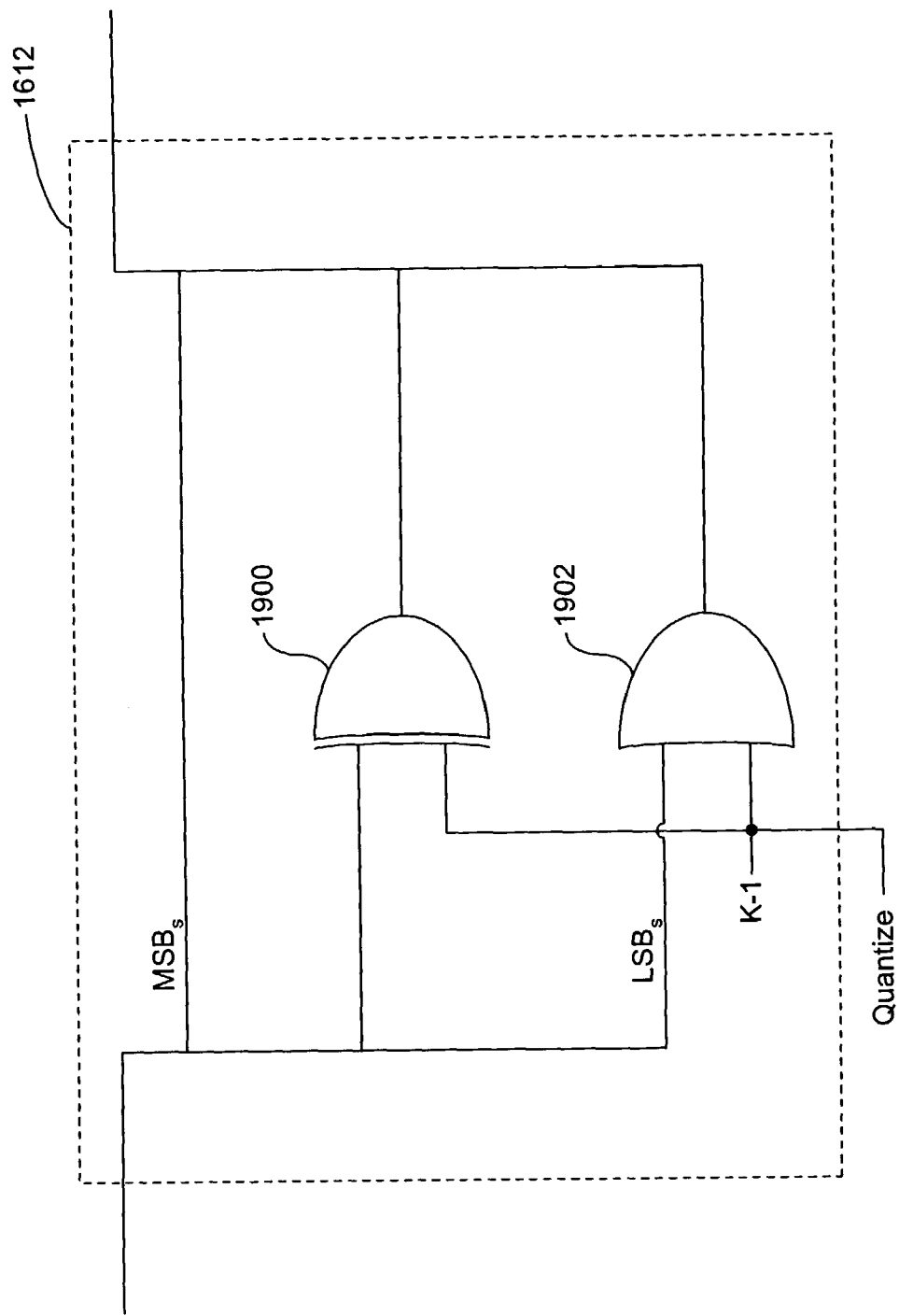
FIG. 19 is an illustration of an exemplary quantizer used in the system of FIG. 16.

In FIG. 19, the quantizer circuit 1612 includes an OR gate 1900 and an AND gate 1902 coupled to the OR gate 1900. A quantize signal is provided by the DSP control logic as a control signal to activate the quantizer 1612. At a more detailed level, the quantizer masks the k LSBs of the symbol data prior to storage in a results register 1614 (accumulator) to implement the quantization of each component when enabled. Also added to the results register 1614 are the I and Q conditions (load enable) 1702 from the slice decoder 1702 shown in FIG. 17. The quantized components are compared against constants determined by the constellation size and sign of the component in the accumulator register 1614. In other words, the accumulator results register 1614 compares the results of the quantizer with the actual I and Q input data symbol conditions.

The quantizer 1612 essentially forces the LSBs of the receive symbol data, to zero. The k−1 bits go through the AND gate 1902 and the next bits are received by the OR gate 1900. The most significant bits, which are left over, simply pass through the quantizer 1612 and remain unchanged. When the quantizer 1612 is in use, the adder 1509 can be used to implement symmetric rounding (about the point origin) and/or offset adjustment for constellations that aren't centered about the point origin.

Finally, an output from the results register 1614 is provided to the scalar 1511. The results scalar 1511 is used to divide each component by $2^{(k-b)}$ to return the components to the input format. The output of the scalar 1511 is a determination of the nearest grid points to the points A and B, within the constellation grid 1800. An exemplary slicing sequence implemented by the data module 1600 will be described in relation to a description of FIG. 20.

FIG. 20 is an exemplary table 2000 representative of two input cycles of the data module 1600. In FIG. 20, data points A and B are shown along a vertical column to the left. A "cycle" column shows two input cycles of the data path module 1600 for receiving input symbol data related to data points A and B. In cycle 1, the table 2000 shows that a quantize enable signal is "set" to activate the quantizer 1612. Since the quantize signal is present, the limits and conditions, included in the table 2000, are not used. Thus, the module 1600 will select the nearest grid point in infinite grid.

The grid 1800 illustrates that the nearest grid point in infinite grid of the I and Q coordinates, for point A, are −1 and −1. In cycle 2, the quantization has already been accomplished so the quantization signal is not set. Thus, the next comparison of the input symbol data is against the limits. Here, the I limit is −3 and a condition of "less than." The conditions of "less than" or "greater than" are a function of the quadrant that the point appeared in.

Similarly, for Q, the limit is −3, with a condition of "less than." Since in this case, the nearest point on infinite grid was within the actual 4×4 grid, the second cycle did not make any changes. Therefore, the result of the symbol slicing in this case was −1 and −1 for both the I and Q components, which correspond with a point on the grid 1800. The results for the point B, however, are slightly different.

The table 2000 illustrates that for the cycle 1, the quantize control signal is set. Therefore, the first step will be to quantize the symbol data associated with B onto the infinite grid. In this case, the output coordinates for I and Q are 1 and −5 respectively. The first arrow pointing away from point B on the grid 1800, points to the coordinates 1 and −5 for I and Q respectively. During cycle 2, the point B is compared against the limit of the finite grid. This comparison illustrates that the data point B is outside of this limit. Here, therefore, the result of cycle 2 is 1 and −3 for the I and Q limits, respectively. Thus, both points A and point B have now been associated with their nearest points in infinite grid, and consequently, associated with their original constellation grid coordinates.

The present invention, therefore, provides an approach for slicing operations to be more efficiently supported directly on a programmable DSP. The approach of the invention is facilitated through extensions to the instruction set, modifications to internal data paths, and use of control logic. The slicing operations are implemented using the data path logic that is provided for other basic operations. This approach facilitates performing the slice instruction as a primitive instruction. An advantage of the approach of the present invention is a reduction in the input cycles required to execute a slice instruction. The present invention reduces the required cycles from 20 to 2 or 3 cycles.

VI. Program Synchronization of A Processor and DMA Using Ownership Flags.

A processor DSP is often paired with a DMA engine and two working memories so that processor execution on data in one memory can overlap DMA transfers to and from the other memory. Higher performance processors require more bandwidth than can be provided by a single working memory; additional bandwidth can be supplied by additional working memories. A synchronization mechanism is required to ensure than a given working memory is only in use by either the processor or the DMA at any given time, and to provide flow control of data passed between the processor and DMA engine.

Figure 21:
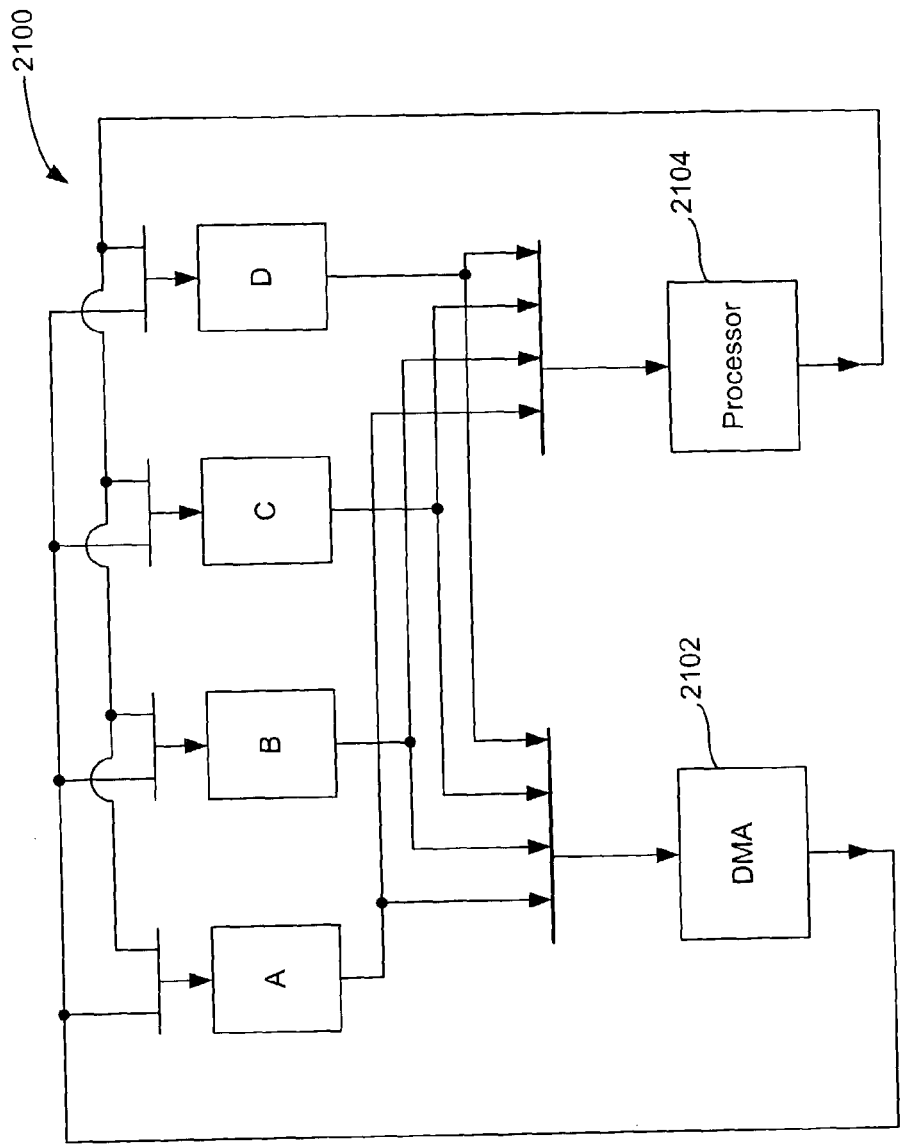
FIG. 21 is block diagram of an exemplary memory sharing scheme configured in accordance with an embodiment of the present invention.
Figure 21:
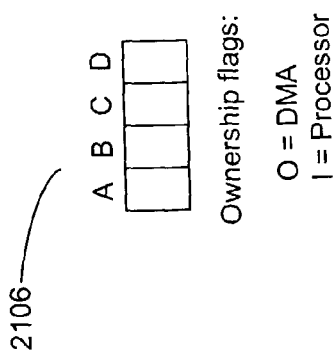

FIG. 21 is a block diagram illustration of an exemplary processor/DMA memory sharing scheme 2100. In FIG. 21, the memory sharing scheme 2100 includes another exemplary DMA engine 2102, a processor 2104, memories A-D, and associated ownership flags 2106.

Figure 22:
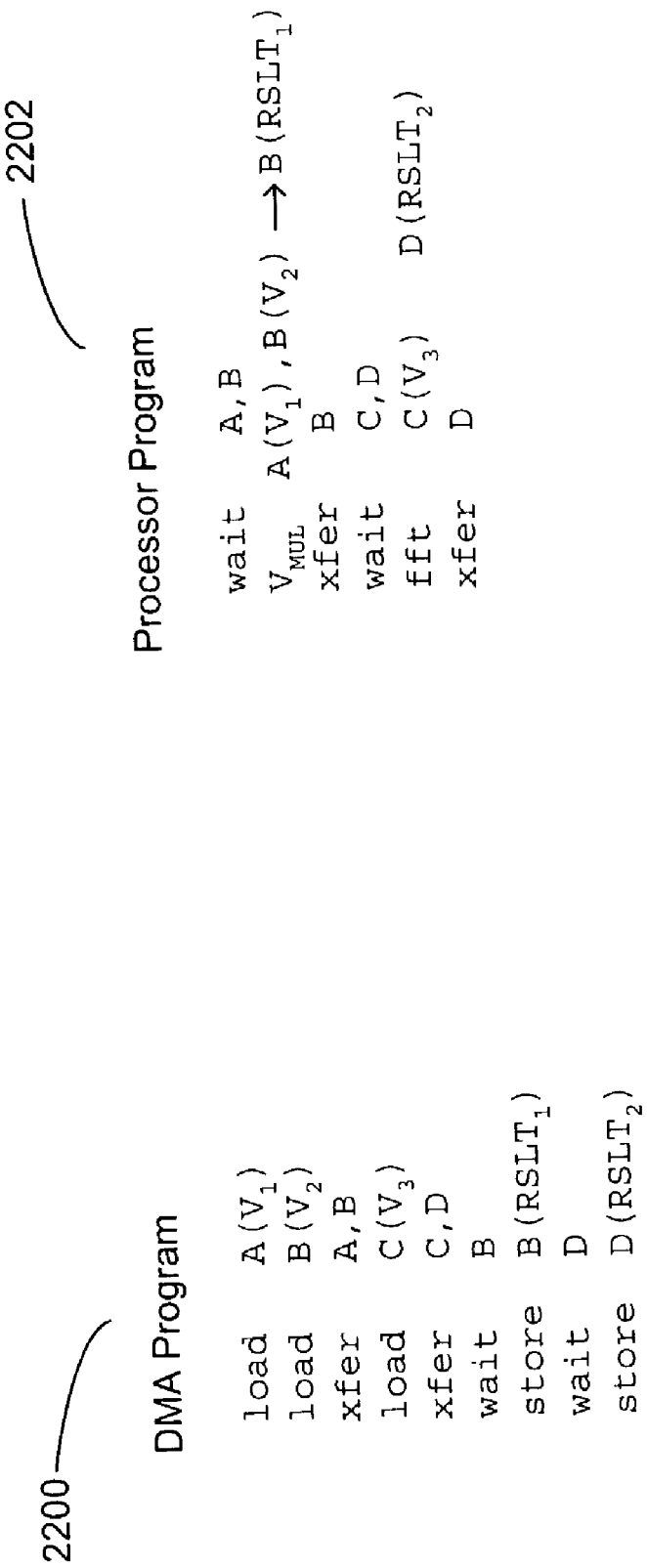
FIG. 22 is an illustration of exemplary instruction used in the memory sharing scheme depicted in FIG. 21.

FIG. 22 is an illustration of exemplary DMA program instructions 2200 and processor program instructions 2202, used in connection with the DMA engine 2102, the processor 2104, and the memories A-D.

Figure 23:
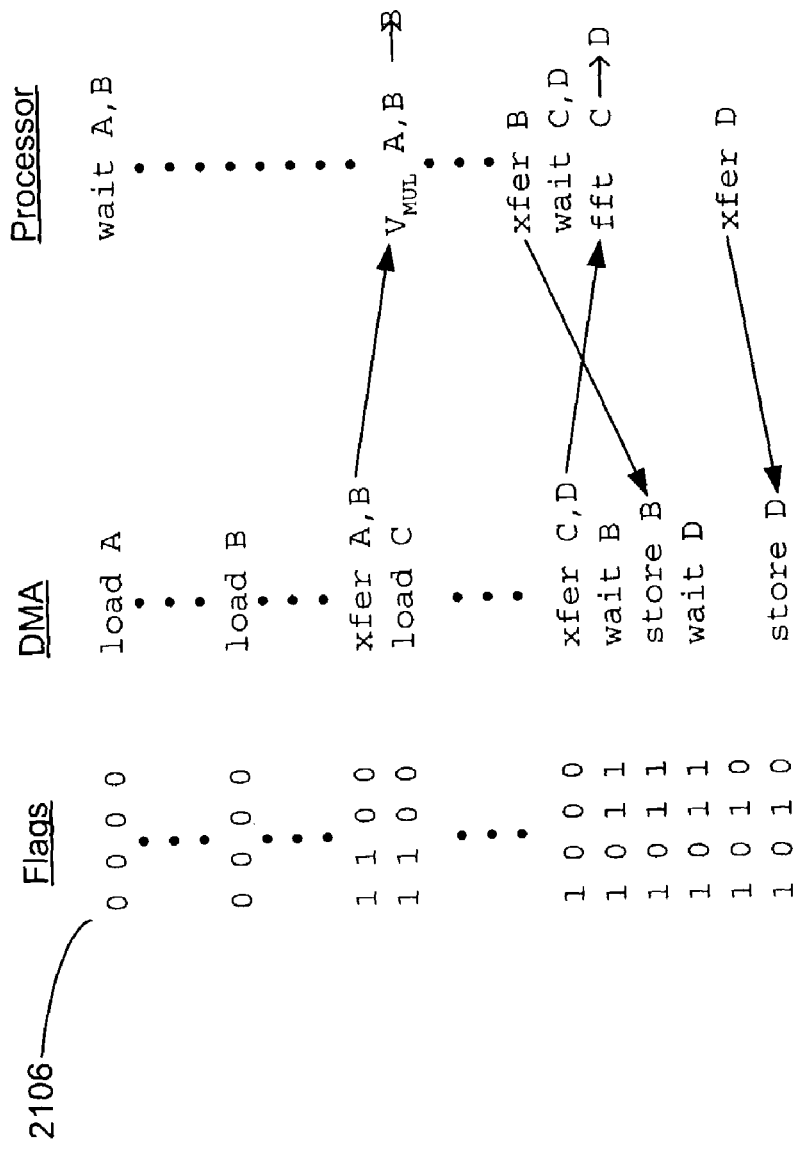
FIG. 23 is an illustration of additional exemplary instructions used in the memory sharing scheme depicted in FIG. 21.

Finally, FIG. 23 is an illustration of management and execution of the DMA program instruction 2200 and the processor program instructions 2202 based upon specific settings of the ownership flags 2106.

Systems with two or more working memories, such as the memories A-D, typically have the DMA engine 2102 and processor 2102 wait for each other upon completion of the tasks 2200 and 2202, shown in FIG. 22. When both the DMA engine 2102 and the processor 2104 have finished, the roles of the memories A-D are swapped and the DMA engine 2102 and the processor 2104 continue with the next set of tasks. This process is repeated for each set of tasks.

The ownership flags 2106 are provided to indicate, for each of the memories A-D, whether its use is controlled by the DMA engine 2102 or processor 2104. Specific instruction sets are provided for both the DMA engine 2102 and the processor 2104 for testing and setting the flags 2106. One instruction, from within the instruction set 2102, waits for the specified set of ownership flags to indicate ownership by the DMA engine 2102 or the processor 2104 executing the instruction. The other instruction sets the specified set of ownership flags 2106 to indicate ownership by the DMA engine 2102 or the processor 2104 not executing the instruction.

The memory sharing scheme 2100, along with software convention, allows programs running on the DMA engine 2102 and the processor 2104. The scheme 2100 avoids simultaneous use of the exemplary working memories A-D by transferring ownership of the memories, when finished with the memory, and waiting for ownership before accessing the memory. Similarly flow control is implemented by waiting for ownership of the memory containing the data being transferred before operating on it.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application specific integrated circuits, firmware, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A modem comprising:
a receiver associated with a receive timing scheme;
a transmitter associated with a transmit timing scheme; and
only one timing mechanism (i) using only a symbol clock derived from a signal received as input to the receiver wherein the symbol clock represents the receive timing scheme, (ii) electrically coupled to the receiver and the transmitter, (iii) including a single phase accumulator shared between the receiver and transmitter, configured to synchronize the receive and transmit timing schemes, and (iv) including a single coefficient generator shared between the receiver and transmitter,
wherein the single coefficient generator is (i) coupled directly to the transmitter and the receiver, (ii) configured to receive re-sampler control signals based on the single phase accumulator, and (iii) provide a set of receive re-sampler coefficients directly from the single coefficient generator to the receiver, and provide a set of transmit re-sampler coefficients directly from the single coefficient generator to the transmitter, based on the received re-sampler control signals.

2. The modem of claim 1, wherein the receiver includes a receive re-sampler and the transmitter includes a transmit re-sampler.

3. The modem of claim 2, wherein the modem is an asymmetric digital subscriber line (ADSL) modem.

4. A modem comprising:
a receive re-sampler;
a transmit re-sampler connected, at least indirectly, to the receive re-sampler; and
only one timing mechanism (i) electrically connected to the receive re-sampler and the transmit re-sampler and (ii) including a single coefficient generator shared between the receive and transmit re-samplers;
wherein the timing mechanism includes a single phase accumulator configured to synchronize a receive timing scheme and a transmit timing scheme and is based on a symbol clock derived from a signal received as input to the receiver.

5. The modem of claim 4, wherein the modem is an asymmetric digital subscriber line (ADSL) modem.

6. The modem of claim 5, wherein the receive resampler is configured to receive input signals in accordance with the receive timing scheme; and
wherein the receive input signals include digitized input signals.

7. The modem of claim 6, wherein the receive re-sampler produces interpolated signals based upon the received input signals and first timing coefficients.

8. The modem of claim 7, wherein the transmit resampler is configured to transmit output signals in accordance with the transmit timing scheme; and
wherein the transmitted output signals include digitized output signals.

9. The modem of claim 7, wherein the transmitted output signals include second timing coefficients.

10. The modem of claim 9, wherein the first and second timing coefficients are produced based upon linear interpolation, the linear interpolation being a function of phase increment and phase accumulator.

11. The modem of claim 7, further comprising a timing tracking mechanism configured to receive the interpolated signals and produce timing data therefrom.

12. The modem of claim 11, wherein the phase accumulator is configured to (i) receive the timing data and (ii) update the first and second timing coefficients based upon the received timing data.

13. A method for synchronizing timing in a modem re-sampler having only one timing mechanism, configured to receive input data signals and a transmitter configured to produce output data signals, the method comprising:
re-sampling an initially received input data signal based upon a first receive coefficient from a single coefficient generator to produce an interpolated signal thereby;
producing signal phase data based upon the interpolated signal;
generating (i) ensuing receive coefficient signals and (ii) transmit coefficient signals based upon the signal phase data; and
synchronizing subsequently the received input data signals and output data signals in accordance with the ensuing receive coefficient signals and the transmit coefficient signals, respectively.

14. The method of claim 13, wherein the signal phase data includes a phase increment, a phase tweak, and a coefficient factor.

15. The method of claim 13, wherein the updating includes adjusting a phase of the initial coefficient signal.

* * * * *